(12) United States Patent
Matsuo

(10) Patent No.: US 10,014,044 B2
(45) Date of Patent: Jul. 3, 2018

(54) SEMICONDUCTOR DEVICE, BATTERY MONITORING SYSTEM, AND ADDRESS SETTING METHOD OF SEMICONDUCTOR DEVICE

(71) Applicant: LAPIS SEMICONDUCTOR CO., LTD., Kanagawa (JP)

(72) Inventor: Yoshikatsu Matsuo, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 89 days.

(21) Appl. No.: 14/824,114

(22) Filed: Aug. 12, 2015

(65) Prior Publication Data

US 2016/0055890 A1 Feb. 25, 2016

(30) Foreign Application Priority Data

Aug. 19, 2014 (JP) ................. 2014-166899

(51) Int. Cl.

| | |
|---|---|
| *G01N 27/416* | (2006.01) |
| *G11C 8/18* | (2006.01) |
| *G01R 31/36* | (2006.01) |
| *G11C 5/14* | (2006.01) |
| *G11C 8/12* | (2006.01) |

(52) U.S. Cl.
CPC ............ *G11C 8/18* (2013.01); *G01R 31/3658* (2013.01); *G11C 5/141* (2013.01); *G11C 5/143* (2013.01); *G11C 8/12* (2013.01)

(58) Field of Classification Search
CPC .................................. G01R 31/3658

USPC ...................... 324/434; 365/230.01
See application file for complete search history.

(56) References Cited

U.S. PATENT DOCUMENTS

| | | | | |
|---|---|---|---|---|
| 5,715,475 A | * | 2/1998 | Munson | ............ H04L 12/40117 |
| | | | | 348/E7.084 |
| 2010/0280786 A1 | * | 11/2010 | Gorbold | .............. G06F 12/0661 |
| | | | | 702/120 |
| 2013/0265009 A1 | * | 10/2013 | Janz | ...................... H04L 12/417 |
| | | | | 320/134 |

FOREIGN PATENT DOCUMENTS

JP 2014-049087 A 3/2014

* cited by examiner

*Primary Examiner* — David V Henze-Gongola
(74) *Attorney, Agent, or Firm* — Volentine, Whitt & Francos, PLLC

(57) ABSTRACT

A semiconductor device, which is daisy-chain connected with other semiconductor devices, includes a first communication section that receives reception data; a determining section that determines a type of the reception data, and that outputs a first and a second control signal according to the determination; a setting processing section that sets an address value based on the reception data and the second control signal, and that outputs a third control signal according to the setting of the address value; and a second communication section that includes a first input terminal to which the reception data is input, and an output terminal to which a communication line, that transmits transmission data to the other semiconductor devices, is connected, and that causes the first input terminal and the output terminal to be in connected or non-connected state based on the first or the third control signal.

10 Claims, 11 Drawing Sheets

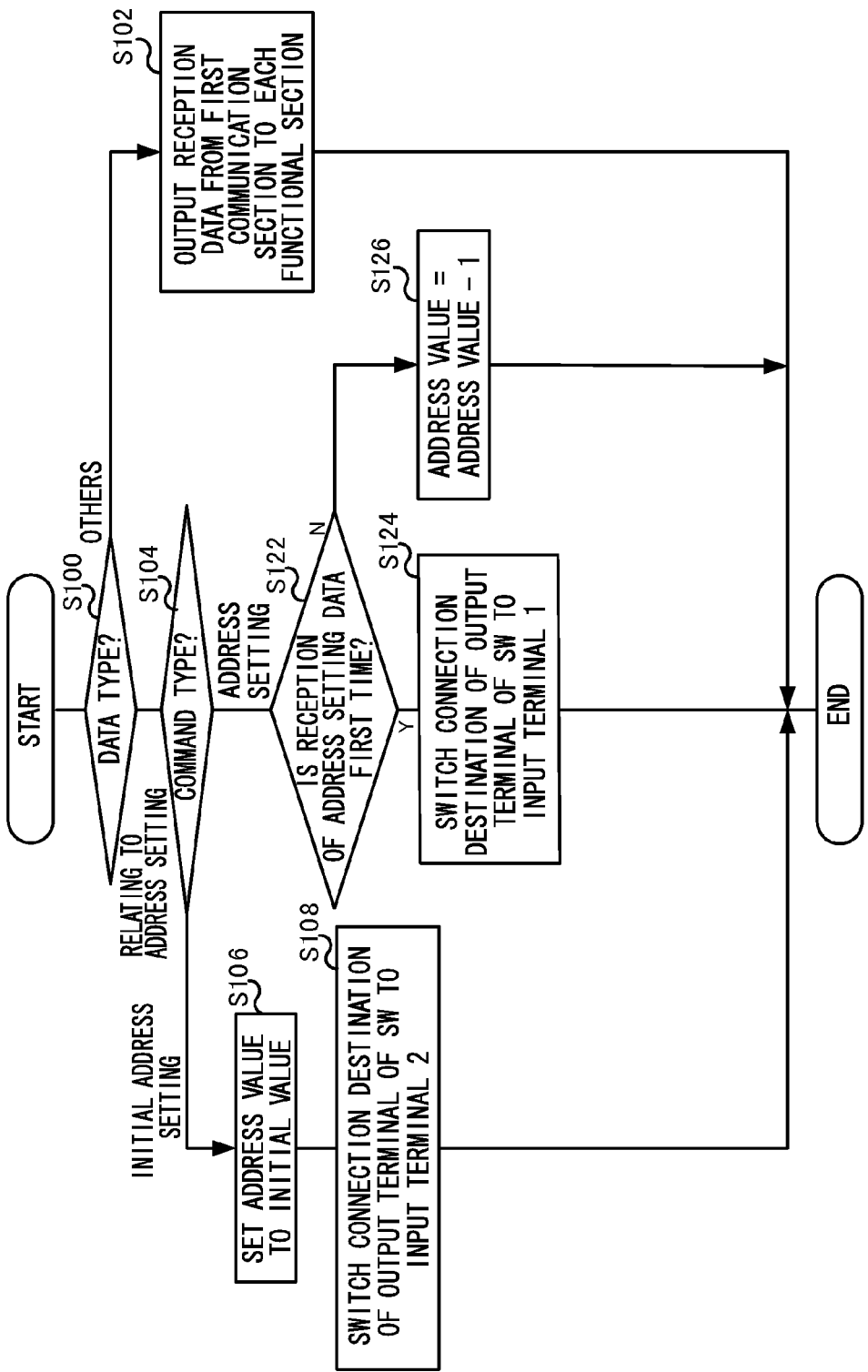

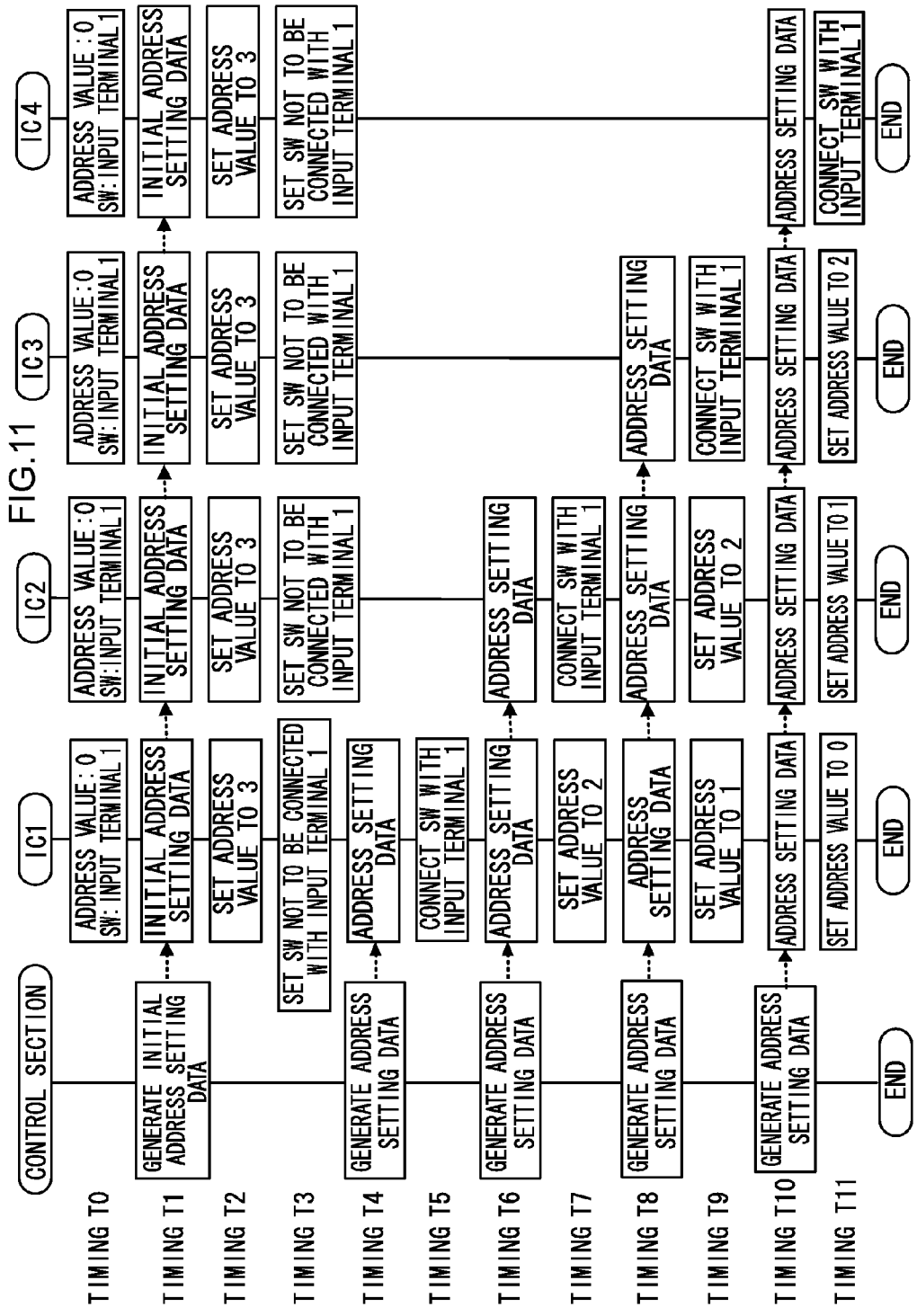

SEMICONDUCTOR DEVICE, BATTERY MONITORING SYSTEM, AND ADDRESS SETTING METHOD OF SEMICONDUCTOR DEVICE

CROSS-REFERENCE TO RELATED APPLICATION

This application claims priority under 35 USC 119 from Japanese Patent Application No. 2014-166899, filed on Aug. 19, 2014, the disclosure of which is incorporated by reference herein.

BACKGROUND OF THE INVENTION

Field of the Invention

The present invention relates to a semiconductor device, a battery monitoring system, and an address setting method of a semiconductor device.

Description of the Related Art

Conventionally, a so-called daisy-chain connected semiconductor devices have been known in which plural semiconductor devices are connected in series and communicate with one another. Further, systems employing such daisy-chain connected semiconductor devices have been known. For example, a battery monitoring system including a daisy-chain connected semiconductor devices that monitor a battery voltage of a battery cell included in a battery, has been known.

In such a system including the daisy-chain connected semiconductor device, an address value is set for each semiconductor device such that a control section that controls the entire system can recognizes each of the semiconductor devices.

As such method for setting an address value, in each of the semiconductor devices, setting a address value of itself by adding a predetermined value to an address information input from a semiconductor device of a previous stage, outputting the added address value of itself to a semiconductor device of a subsequent stage as the address information (hereinafter, referred to as a "first setting method"), is known. (For example, see Japanese Patent Application Laid-Open (JP-A) No. 2014-49087)

Further, as another method for setting of an address value, in each of the semiconductor devices, setting an address by setting address information input from a semiconductor device of a previous stage as an address value of itself, and outputting a value, obtained by adding a predetermined value to the address value of itself, as address information, to a semiconductor device at a subsequent stage, is known (hereinafter, referred to as a "second setting method").

Further, as another method for setting an address value, setting an address value by causing a control section, that controls the entire system, to generate the number of address information corresponding to each semiconductor device in the daisy-chain connection, and to output the address information to each of the semiconductor devices, is known (hereinafter, referred to as a "third setting method").

However, in the first and second setting methods described above, there may be cases in which the address value setting are not accurately performed, due to a gap in a reference clock frequency (deviation in cycle) that serves a reference for performing each operation including generation of the address information, in each of the semiconductor devices. In such cases, for example, an overlapped address value may be set in the semiconductor devices that differ from one another.

Further, in the third setting method described above, a load of the control section increases, since the control section needs to generate the entire address information of the semiconductor devices.

SUMMARY OF THE INVENTION

The present invention provides a semiconductor device, a battery monitoring system, and an address setting method of a semiconductor device, that may suppress a load of a control section, and that may appropriately perform setting of an address value.

The first aspect of the present invention is a semiconductor device that is daisy-chain connected with other semiconductor devices, the semiconductor device including: a first communication section that receives reception data; a determining section that determines a type of the reception data, and that outputs a first control signal and a second control signal according to a result of the determination; a setting processing section that sets an address value in a memory section based on the reception data and the second control signal, and that outputs a third control signal according to the setting of the address value; and a second communication section that includes a first input terminal to which the reception data is input, and an output terminal to which a communication line, that transmits transmission data to the other semiconductor devices, is connected, and that causes the first input terminal and the output terminal to be in a connected state or a non-connected state based on the first control signal or the third control signal.

The second aspect of the present invention is a battery monitoring system including: a plurality of battery cells that are connected in series; a plurality of the semiconductor device according to claim 1 that are daisy-chain connected with each other, the plurality of the semiconductor devices measuring a battery voltage of the plurality of battery cells, and communicating a result of the measurement outside of the plurality of the semiconductor devices using a first communication section and a second communication section; and a control section that controls the plurality of the semiconductor devices, that receives the measurement result from the plurality of the semiconductor devices, and that is connected to any one of the plurality of the semiconductor devices.

The third aspect of the invention is an address setting method of a semiconductor device that is daisy-chain connected with other semiconductor devices, the method including: receiving reception data by a first communication section; determining, by a determining section, a type of the reception data, and generating and outputting a first control signal and a second control signal according to a result of the determination; setting, by a setting processing section, an address value in a memory section based on the reception data and the second control signal, and outputting a third control signal according to the setting of the address value; and causing, by a second communication section that includes a first input terminal to which the reception data is input, and an output terminal to which a communication line that transmits transmission data to the other semiconductor devices is connected, the first input terminal and the output terminal to be in a connected state or a non-connected state based on the first control signal or the third control signal.

According to the above aspects, the present invention may suppress the load of the control section, and may appropriately set an address value.

BRIEF DESCRIPTION OF THE DRAWINGS

Exemplary embodiments of the present invention will be described in detail based on the following figures, wherein:

FIG. 10 is a flowchart representing a flow of the address value setting operation in each IC according to the third exemplary embodiment;

FIG. 11 is a flowchart representing a flow of a setting operation in a control section and each IC according to the third exemplary embodiment.

DETAILED DESCRIPTION OF THE INVENTION

Hereinafter, a description will be made regarding a battery monitoring system including a battery monitoring integrated circuit (IC) as an example of a semiconductor device according to the present invention, with reference to the drawings.

First Exemplary Embodiment

Figure 1:
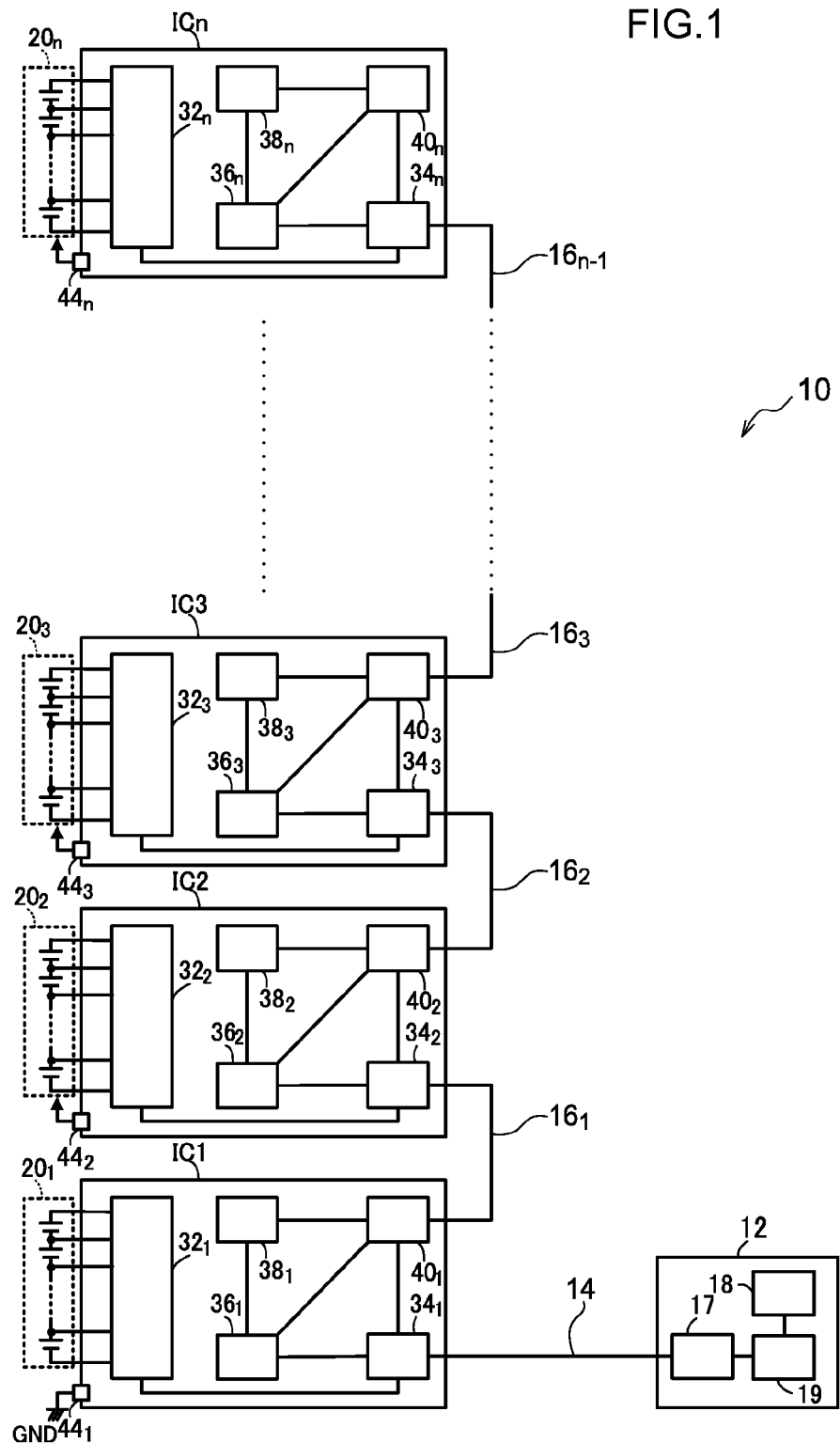
FIG. 1 is a schematic configuration diagram illustrating a schematic configuration of a battery monitoring system according to a first exemplary embodiment.
Figure 2:
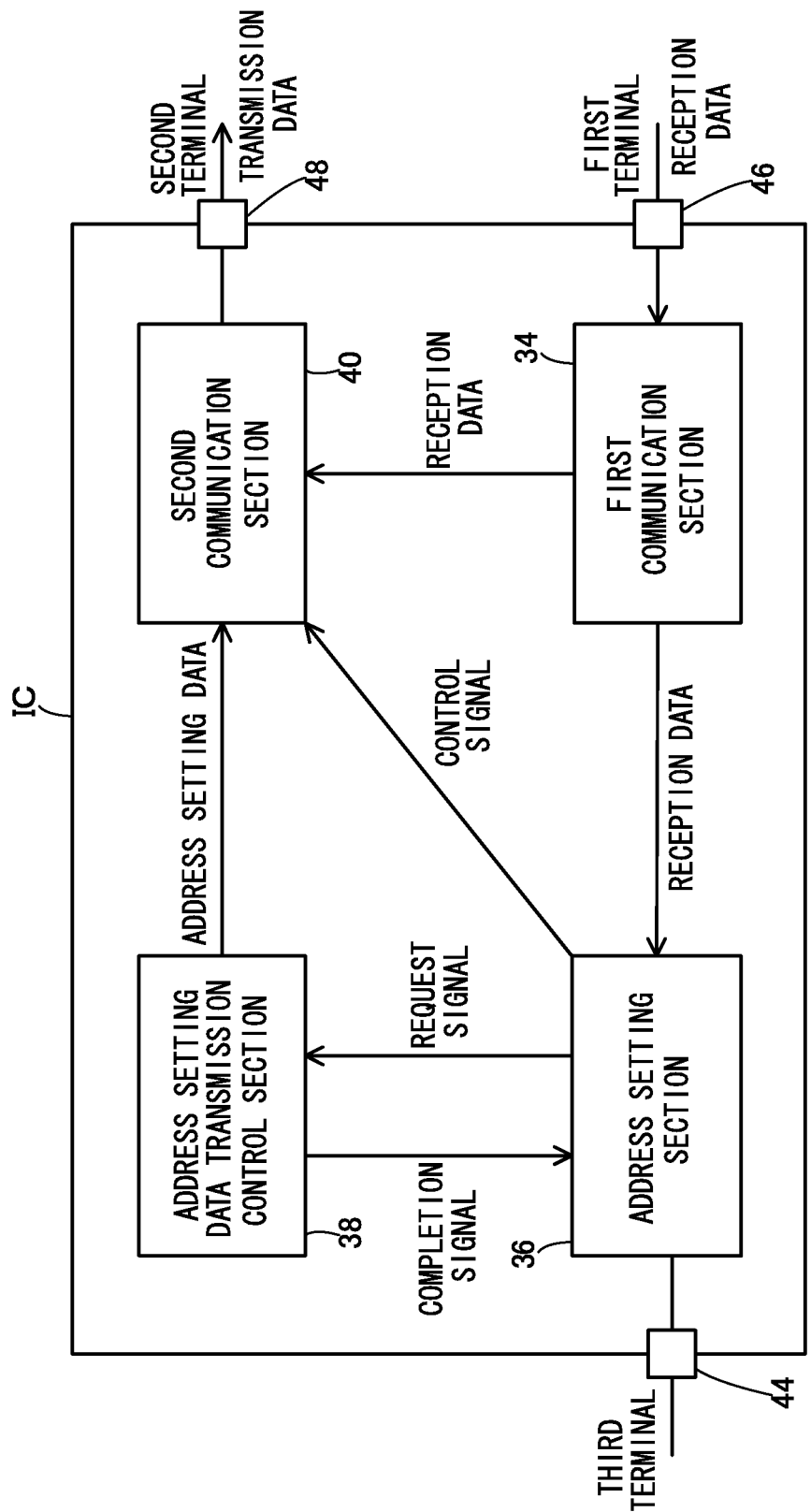
FIG. 2 is a diagram illustrating a functional section of each IC for setting an address value for recognition in each IC by a control section in the battery monitoring system according to the first exemplary embodiment.

First, a description will be made regarding a schematic configuration of the entire battery monitoring system according to a first exemplary embodiment. FIG. 1 illustrates a schematic configuration diagram of a battery monitoring system according to the first exemplary embodiment. Further, FIG. 2 illustrates a functional section of each IC for setting an address value for recognition of each IC by a control section in the battery monitoring system according to the first exemplary embodiment.

A battery monitoring system 10 includes n batteries 20 ($20_1$ to $20_n$, n is a natural number of one or more), n IC's (IC1 to ICn), and a control section 12. Note that, hereinafter, the batteries $20_1$ to $20_n$ and the IC1 to ICn may be indicated as the "battery 20" and the "IC", in cases in which collectively referred, and may be indicated with each reference numeral in cases in which individuals thereof are distinguishing.

Each battery 20 includes plural battery cells C. The number of the battery cells C included in each battery 20 is arbitrary. For example, all the batteries 20 may have the same number of the battery cells C, or each battery 20 may have different number of the battery cells C. The battery cells C included in each battery 20 are connected in series. A lithium ion secondary battery cell may be a specific example of the battery cell C.

The control section 12 controls the entire battery monitoring system 10 and causes each IC to measure and monitor a battery voltage of the battery cell C of the battery 20. The control section 12 includes a communication section 17, a memory section 18, and a central processing section (CPU) 19. The CPU 19 controls the control section 12 by executing various programs stored in the memory section 18, and thereby controls the entire battery monitoring system 10. The various programs executed by the CPU 19, using a non-volatile memory or the like, or various types of information for generating and transmitting initial address setting data, for example, are stored in the memory section 18. The communication section 17 is connected with a first communication section $34_1$ of the IC1.

The IC measures and monitors a battery voltage of the battery cell C included in the battery 20. As illustrated in FIG. 1, in the battery monitoring system 10 according to the first exemplary embodiment, all the IC's are connected in series by communication lines 16 ($16_1$ to $16_{n-1}$), in a so-called daisy-chain connection, having the IC1 at the lowermost stage and the ICn at the uppermost stage. Hereinafter, similarly to the IC, the communication lines $16_1$ to $16_{n-1}$ may be indicated by the "communication line 16" in cases in which they are collectively referred, and may indicated with individual reference numeral in cases in which individuals thereof are distinguishing.

The IC includes battery monitoring sections 32 ($32_1$ to $32_n$), first communication sections 34 ($34_1$ to $34_n$), address setting sections 36 ($36_1$ to $36_n$), address setting data transmission control sections 38 ($38_1$ to $38_n$), second communication sections 40 ($40_1$ to $40_n$), and third terminals 44 ($44_1$ to $44_n$). Hereinafter, similarly to the IC, the battery monitoring sections $32_1$ to $32_n$, the first communication sections $34_1$ to $34_n$, the address setting sections $36_1$ to $36_n$, the address setting data transmission control sections $38_1$ to $38_n$, the second communication sections $40_1$ to $40_n$, and the third terminals $44_1$ to $44_n$, may be indicated as the "battery monitoring section 32", the "first communication section 34", the "address setting section 36", the "address setting data transmission control section 38", the "second communication section 40", and the "third terminal 44", respectively, in cases in which they are collectively referred, and may be indicated with each individual reference numeral in cases in which they are individually distinguishing. Further, each IC includes a first terminal 46, and a second terminal 48, as illustrated in FIG. 2.

The battery monitoring section 32 is connected with the battery 20 and measures (monitoring) a battery voltage of the connected battery 20. Examples of the battery monitoring section 32 include a battery monitoring section including a switching element corresponding to the number of the battery cells C included in the battery 20. In such case, the battery monitoring section 32 selects, by the switching element, a battery voltage line connected to a high potential side of the battery cell C as a target of the measurement (monitor) of a battery voltage, and a battery voltage line connected to a low potential side, and measures (monitors) a battery voltage of the target battery cell C based on a potential of the battery voltage line connected to the high potential side and a potential the battery voltage line connected to the low potential side. A result of the measurement (monitor) is output to the control section 12 via the communication line 16 and the communication line 14. Namely, the result measured by the IC at an upper-stage is output to the control section 12 via the IC at a lower-stage using the communication line 16.

The first communication section 34 communicates with the control section 12 via the communication line 14 in the IC1. Further, the IC2 to the ICn communicates with the lower stage IC1 to the ICn−1 via the communication line 16$_1$ to 16$_{n-1}$ respectively.

In the IC1 to the ICn−1, the second communication section 40 communicates with the IC2 to the ICn at the upper stage via the communication line 16$_1$ to 16$_{n-1}$ respectively. Note that, since the upper-stage IC is not present to the ICn, in the ICn, transmission data is not output to outside from the second communication section 40, although the ICn according to the first exemplary embodiment has the second communication section 40. Further, the second communication section 40 according to the first exemplary embodiment selects transmission data that are to be transmitted to the upper-stage IC (details thereof will be described below).

At the third terminal 44, an identification signal for identifying whether the communication with control section 12 is performed is input thereto. In the first exemplary embodiment, for example, an IC, in which an identification signal of an L level is input to the third terminal 44, performs communication with the control section 12, and an IC, in which an identification signal of an H level is input to the third terminal 44, does not perform communication with the control section 12. In the first exemplary embodiment, as a specific example, a ground (GND) potential is used as the L level. The third terminal 44 is connected to ground (GND) in the IC1. The identification signal input to the third terminal 44 is output to the address setting section 36.

In each IC, the address setting section 36 and the address setting data transmission control section 38 sets an address value for allowing the control section 12 to recognize each of the ICs (details thereof will be described below).

Reception data received from the outside is output from the first communication section 34 to the address setting section 36 and the second communication section 40 via the first terminal 46.

A request signal for requesting generation of address setting data is output from the address setting section 36 to the address setting data transmission control section 38. The request signal includes an address setting data generation request signal illustrated in FIG. 3, which will be described below in detail. Further, a control signal for controlling the selection of data in the second communication section 40 is output from the address setting section 36 to the second communication section 40. The control signal includes an address setting identification signal as an example of a first control signal illustrate in FIG. 3, which will be described below in detail. Further, the control signal includes an address setting completion signal and an initial address setting identification signal as examples of a third control signal illustrated in FIG. 3, which will be described below in detail.

A completion signal that indicates completion of setting of an address value is output from the address setting data transmission control section 38 to the address setting section 36. The completion signal includes an address calculation process request signal illustrated in FIG. 3, which will be described below in detail. Further, the address setting data is output from the address setting data transmission control section 38 to the second communication section 40. The transmission data is transmitted from the second communication section 40 to the outside via the second terminal 48. The transmission data in the IC according to the first exemplary embodiment is the address setting data or the reception data.

Figure 3:
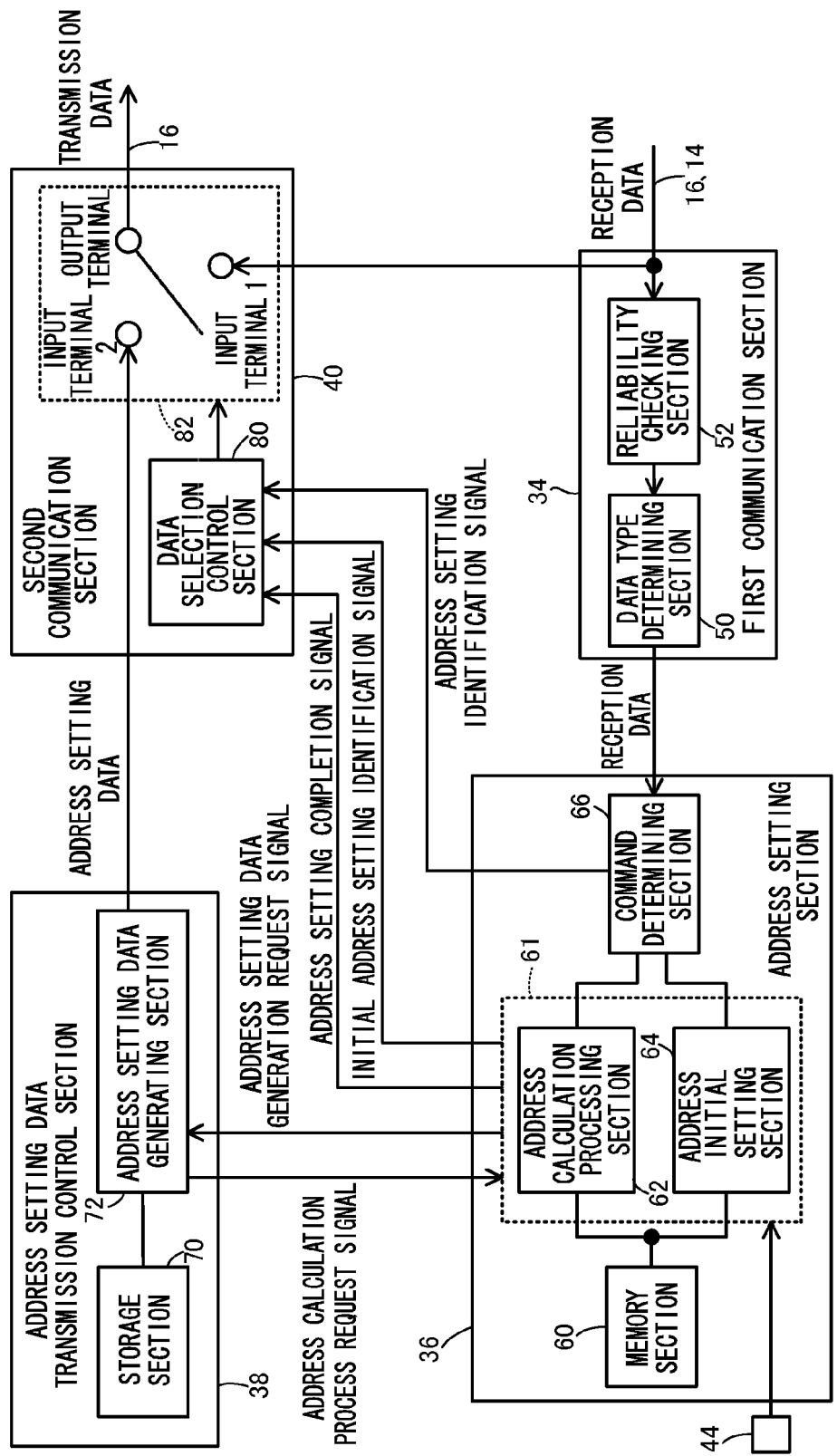
FIG. 3 is a functional block diagram representing a detailed example of a first communication section, an address setting section, an address setting data transmission control section, and a second communication section of the IC according to the first exemplary embodiment.

FIG. 3 illustrates a functional block diagram representing detailed examples of the first communication section 34, the address setting section 36, the address setting data transmission control section 38, and the second communication section 40.

The first communication section 34 includes a data type determining section 50 and a reliability checking section 52. The reception data received via the communication line 14 or the communication line 16 is input to the first communication section 34. The reception data input to the first communication section 34 is output directly to the second communication section 40, and further, input to the reliability checking section 52. The reliability checking section 52 checks whether the reception data satisfies a reliability standard, which is set in advance, based on reliability checking data included in the reception data. In a case where the reception data satisfies the reliability standard, the reliability checking section 52 outputs the reception data to the data type determining section 50. The reliability checking data is data for checking reliability such as whether data destruction occurs due to the communication. The reliability checking data may be any data by which the reliability check can be performed. Cyclic redundancy checking (CRC) may be an example, however it is not limited thereto. In a case where the reliability is not satisfied, a predetermined error handling is performed. Note that the reliability checking section 52 may not be provided, however, in order to operate the IC (the battery monitoring system 10) appropriately, it is preferred to be provided.

The data type determining section 50 determines a type of reception data and allocates output destination of reception data inside the IC, such that an appropriate process is performed according to the type. In a case where the reception data is data relating to the setting of an address, the data type determining section 50 outputs the reception data to the address setting section 36. In a case where the reception data is another type, the data type determining section 50 outputs the reception data to a functional section (not illustrated) inside the IC according to the type.

As illustrated in FIG. 3, the address setting section 36 includes a memory section 60, an address setting processing section 61 as an example of a setting processing section, and a command determining section 66 as an example of a determining section. Further, the address setting processing section 61 includes an address calculation processing section 62 and an initial address setting section 64. The address setting section 36 sets an address value, which indicates the subject IC, based on the reception data.

The address value is set in the memory section 60, and the memory section 60 is a memory or the like, for example.

The command determining section 66 has a function of determining a command type of the reception data input from the first communication section 34 and outputs a signal indicating a result of the determination to the address setting processing section 61. Namely, the command determining section 66 according to the first exemplary embodiment determines any one of an initial address setting command or an address setting command due to the command type of the reception data indicates, thereby determining whether the reception data is the initial address setting data or the address setting data, and outputs the signal that indicates the determination result to the address setting processing section 61.

The signal output from the command determining section 66 to the address setting processing section 61 is an example of a second control signal.

The initial address setting data according to the first exemplary embodiment includes the initial address setting command, an IC selection command (all the IC's, or designating an IC), IC stage number designation data, the reliability checking data or the like.

Further, the command determining section 66 generates the address setting identification signal and outputs the address setting identification signal to a data selection control section 80, in a case where address setting data is received for the first time after initial setting of an address value. The address setting identification signal is a signal of causing the data selection control section 80 to perform a control of switching a connection destination of an output terminal of a switching element (SW) 82 from an input terminal 2 to an input terminal 1, in a case where address setting data is received for the first time after the initial setting of an address value.

The initial address setting section 64 of the address setting processing section 61 sets an initial value of the address value based on the reception data in the memory section 60, in a case where a command type is the initial address setting command. Further, the initial address setting section 64 generates the initial address setting identification signal and outputs the initial address setting identification signal to the second communication section 40, according to a level of the identification signal input to the initial value and the third terminal 44. The initial address setting identification signal is a signal of causing the data selection control section 80 to perform a control of switching the connection destination of the output terminal of the SW 82 from the input terminal 1 to the input terminal 2, in a case where the address setting processing section 61 sets the initial value of the address value in the memory section 60.

The address calculation processing section 62 of the address setting processing section 61 performs calculation of an address value and sets an address value in the memory section 60 based on a result of the calculation. Namely, the address calculation processing section 62 reads out the set address value from the memory section 60, performs calculation, and sets the calculation result as an address value in the memory section 60, in a case where a command type is the address setting command, or a case where the address calculation process request signal is input from the address setting data transmission control section 38. Further, the address calculation processing section 62 outputs the address setting data generation request signal to the address setting data transmission control section 38, according to the identification signal input to the third terminal 44 and the address value which has been set in the memory section 60. The address setting data generation request signal is a signal for requesting generation of address setting data to the address setting data generating section 72, in a case where the reception of address setting data is not the first time. Further, the address calculation processing section 62 generates the address setting completion signal and outputs the address setting completion signal to the data selection control section 80, in a case where the setting of the address value in the memory section 60 is completed. The address setting completion signal is a signal of causing the data selection control section 80 to perform the control of switching the connection destination of the output terminal of the SW 82 from the input terminal 2 to the input terminal 1, in a case where the setting of the address value in the memory section 60 is completed.

As illustrated in FIG. 3, the address setting data transmission control section 38 according to the first exemplary embodiment includes a storage section 70 and an address setting data generating section 72.

The storage section 70 stores the address setting command and the reliability checking data in advance. The storage section 70 is, for example, a non-volatile memory or the like.

The address setting data generating section 72 reads-out the address setting command and the reliability checking data from the storage section 70, generates the address setting data, and outputs the address setting data to the second communication section 40, in a case where the address setting data generation request signal is input from the address setting processing section 61 of the address setting section 36. In this manner, the address setting data according to the first exemplary embodiment includes the address setting command and the reliability checking data. However, the reliability checking data may not be necessary in a case where the reliability check is not performed. Note that, the address setting data generating section 72 does not generate the address setting data in the IC2 to the IC4 according to the first exemplary embodiment, which will be described below in detail.

Further, the address setting data generating section 72 according to the first exemplary embodiment has a function of generating the address calculation process request signal and outputting the address calculation process request signal to the address setting processing section 61 of the address setting section 36 in a case where the output of the address setting data is completed. The address calculation process request signal is a signal for requesting the calculation process of the address value in the address setting processing section 61, in a case where the output of the address setting data is completed.

As illustrated in FIG. 3, the second communication section 40 according to the first exemplary embodiment includes the data selection control section 80 and the SW 82. The SW 82 includes two input terminals (the input terminal 1 and the input terminal 2) and one output terminal. The first communication section 34 is connected to the input terminal 1. In a case where the output terminal is connected to the input terminal 1, the reception data input to the first communication section 34 is transmitted to the outside as the transmission data. Further, the address setting data generating section 72 of the address setting data transmission control section 38 is connected to the input terminal 2. In a case where the output terminal is connected to the input terminal 2, the address setting data is transmitted to the outside as the transmission data.

The data selection control section 80 controls switching of the connection destination of the output terminal of the SW 82 between the input terminal 1 and the input terminal 2, based on the address setting completion signal, the initial address setting identification signal, and the address setting identification signal.

Next, a description will be made regarding the address value setting operation of each IC in the battery monitoring system 10 according to the first exemplary embodiment. Here, as a specific example, the description will be made regarding the address value setting operation in the battery monitoring system 10 in which n=4, that is, four IC's (the IC1 to the IC4) are daisy-chain connected.

Figure 4:
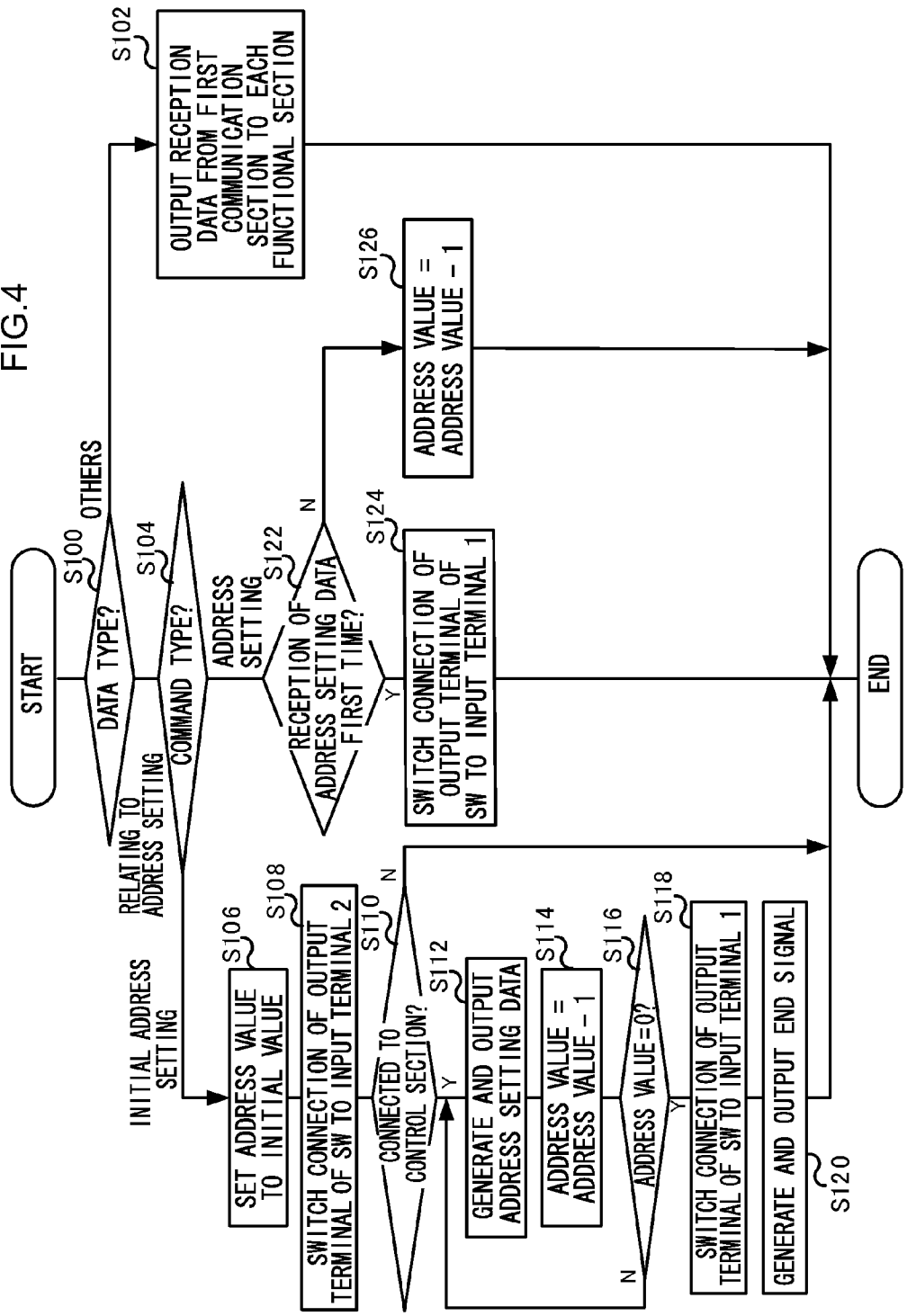
FIG. 4 is a flowchart representing a flow of an address value setting operation in each IC according to the first exemplary embodiment.

FIG. 4 illustrates a flowchart representing an exemplary flow of the address value setting operation in each IC. First, a description will be made regarding an overview of the setting operation of the IC according to the first exemplary embodiment, with reference to the flowchart illustrated in FIG. 4. Then, the setting operation will be described in detail for each IC.

The setting operation illustrated in FIG. 4 starts in a case where the IC receives the reception data. First, in step S100, the data type determining section 50 of the first communication section 34 determines whether a type of the reception data is a type relating to the address setting or another type. In a case where the data type determining section 50 determines that the type of the reception data is another type (a type other than the type relating to the address setting), the process proceeds to step S102. In step S102, the data type determining section 50 outputs the reception data to the functional section (not illustrated) inside the IC, according to the type of the reception data, and then ends the operation.

On the other hand, in a case where the data type determining section 50 determines that the type of the reception data is the type relating to the address setting in step S100, the process proceeds to step S104.

In step S104, the command determining section 66 of the address setting section 36 determines a type of the command of the reception data. In a case where the command type is the initial address setting, that is, in a case where the reception data is the initial address setting data, the process proceeds to step S106.

The setting of the address value is performed at a predetermined timing in a state in which the output terminal of the SW 82 is connected to the input terminal 1, for example, at the time when the power of the battery monitoring system 10 is turned ON. In the case of setting the address value, first, the initial address setting data is transmitted from the control section 12.

In the IC in which the output terminal of the SW 82 of the second communication section 40 is connected to the input terminal 1, the initial address setting data received by the first communication section 34 passes through the inside of the IC, and is transmitted from the second communication section 40 directly to the upper-stage IC, and further is output to the address setting section 36.

In the next step S106, the address setting section 36 of each IC sets the initial value as the address value in the memory section 60 using the initial address setting section 64.

In the next step S108, the connection destination of the output terminal of the SW 82 is switched to the input terminal 2 by the control of the data selection control section 80. Accordingly, the address setting data generated in the address setting data transmission control section 38 is transmitted to the IC at a subsequent stage from the second communication section 40. Further, in each IC, the reception data received from the input terminal 1 of the SW 82 of the second communication section 40 in the previous-stage IC (from the control section 12 in the case of the IC1) is transmitted to the subsequent-stage IC from the SW 82 of the second communication section 40.

In the next step S110, the address setting processing section 61 identifies whether the subject IC is connected to the control section 12, according to the level of the identification signal input to the third terminal 44. In the case of not being connected to the control section 12, the operation ends. On the other hand, in the case of being connected to the control section 12, the process proceeds to step S112.

In step S112, the address setting data generating section 72 of the address setting data transmission control section 38 generates the address setting data and transmits the address setting data to the subsequent-stage IC via the second communication section 40.

In the next step S114, the address calculation processing section 62 of the address setting processing section 61 performs calculation of subtracting "1" from the address value which has been set in the memory section 60, and sets a result of the calculation in the memory section 60 as a new address value.

In the next step S116, the address setting processing section 61 determines whether the address value is "0". In a case where the address value is not "0", the process returns to step S112, and then the generation and output of the address setting data, and the calculation and setting of the address value are repeated. On the other hand, in a case where the address value is "0", the process proceeds to step S118.

In step S118, the connection destination of the output terminal of the SW 82 of the second communication section 40 is switched from the input terminal 2 to the input terminal 1. Accordingly, in the IC1, the reception data received by the first communication section 34 from the control section 12 is transmitted from the second communication section 40 directly to the upper-stage IC (the IC2) after the completion of setting of the address value. On the other hand, the IC1 is in a state in which the second communication section 40 and the address setting data transmission control section 38 are disconnected from one another.

In the next step S120, since the setting of the address value is completed, the address setting section 36 generates an end signal and transmits the end signal to the control section 12, and then, the operation ends. Accordingly, in the IC (the IC at a lowermost stage) connected to the control section 12, when the initial address setting data is received, the generation and the output of the address setting data are repeated, and further, the calculation and the setting of the address value are repeated until the setting of the address value is completed.

On the other hand, in a case where the command determining section 66 determines that the command type is the address setting in step S104, that is, in a case where the reception data is the address setting data, the process proceeds to step S122. In the battery monitoring system 10 according to the first exemplary embodiment, only the IC which is not connected to the control section 12 receives the address setting data.

In step S122, the address setting processing section 61 of the address setting section 36 determines whether the address setting data is received for the first time. In a case where the address setting data is received for the first time, the process proceeds to step S124, the connection destination of the output terminal of the SW 82 is switched to the input terminal 1, and then the operation ends. On the other hand, in a case where the reception of the address setting data is not the first time, (second or subsequent time), the process proceeds to step S126. In step S126, the address calculation processing section 62 of the address setting processing section 61 performs calculation of subtracting "1" from the address value which has been set in the memory section 60, sets a result of the calculation in the memory section 60 as a new address value, and then ends the operation. Accordingly, the operations of steps S100, S104, and S122 to S126 are repeated in the IC, which is not connected to the control section 12, since the address setting data is input until the setting of the address value is completed.

Figure 5:
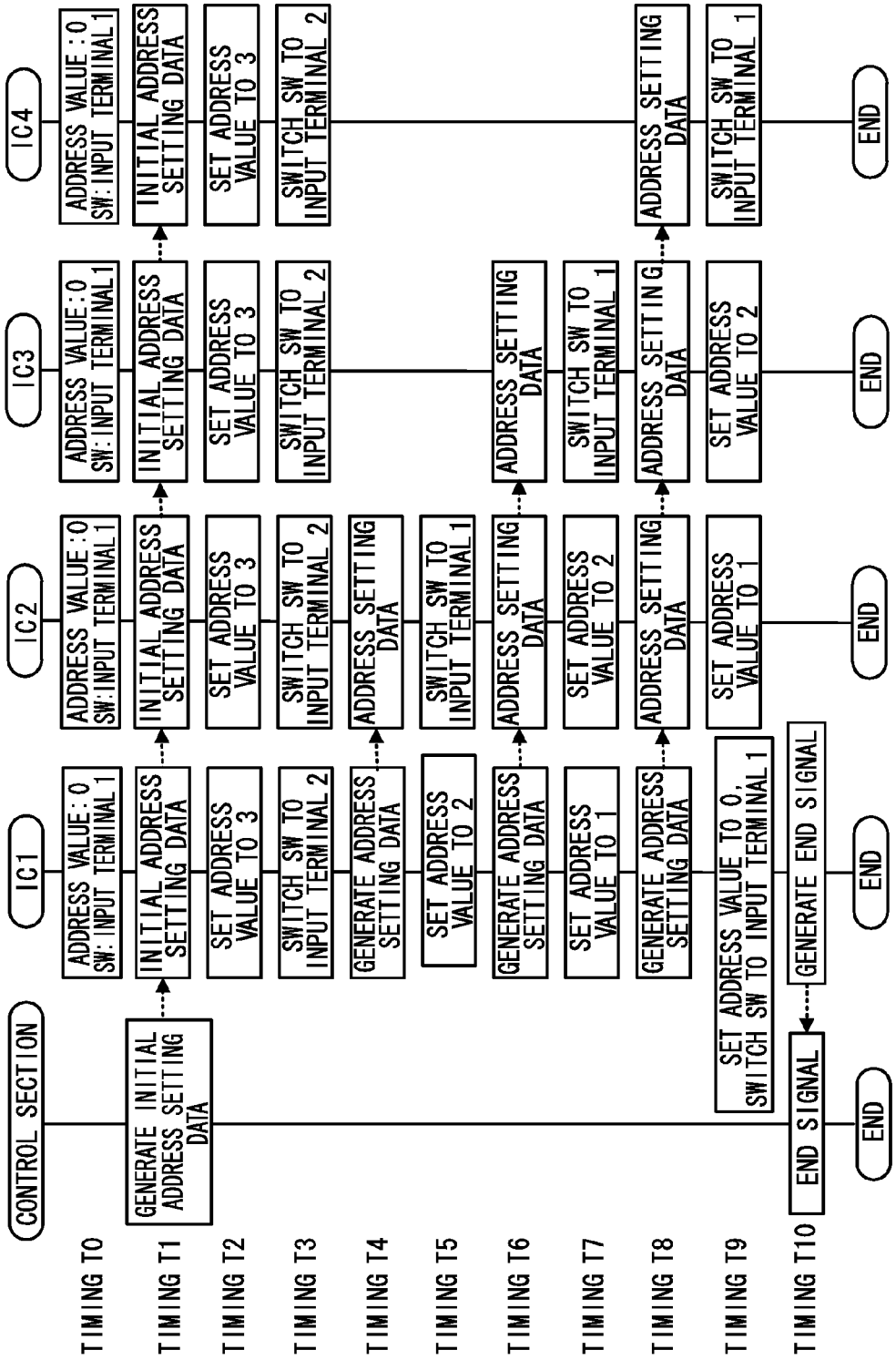
FIG. 5 is a flowchart representing a flow of a setting operation in the control section and each IC according to the first exemplary embodiment.

Next, the detailed setting operation will be described for each IC. FIG. 5 illustrates a flowchart representing an exemplary flow of the setting operation in the control section 12 and each IC.

First, at a timing T0, the battery monitoring system 10 according to the first exemplary embodiment is initialized to be in an operable state when the power thereof is turned ON. First, when the power is turned ON (before the address value setting operation) in an initial state, the address value is set in "0" in all the IC's. Further, the output terminal of the SW 82 of the second communication section 40 is connected to the input terminal 1. Thus, the reception data is output from the first communication section 34 to the second communication section 40 and is transmitted, via the communication line 16, directly to the upper-stage IC as the transmission data.

Next, at a timing T1, the control section 12 transmits the initial address setting data, via the communication line 14, to the IC1 having the initial setting value of the address value of "3" (the number (n) of all stages in the daisy-chain connection−1), using a command which can be set in all the IC's. In each IC, the received initial address setting data is transmitted directly to the subsequent-stage IC since the output terminal of the SW 82 of the second communication section 40 is connected to the input terminal 1. In the IC4 at an uppermost stage, the initial address setting data is not transmitted to the outside since the communication line 16 is not connected to the second communication section 40 at the above.

Further, at timing T1, the reliability check is performed by the reliability checking section 52 of the first communication section 34 to verify the reliability of the reception data in each IC receiving the initial address setting data. In a case where the reliability is satisfied, a type of the reception data is determined in the data type determining section 50. In the case of being determined as data relating to the setting of the address value by the data type determining section 50, the reception data is output to the address setting section 36.

At a timing T2, the command determining section 66 of the address setting section 36 determines a command type of the reception data. In a case where the command determining section 66 determines that the reception data is the initial address setting data, the initial address setting section 64 of the address setting processing section 61 sets the initial setting value of "3" in the memory section 60 as the address value.

Further, at a timing T3, the address setting processing section 61 generates the initial address setting identification signal and outputs the initial address setting identification signal to the second communication section 40. The data selection control section 80 of the second communication section 40 performs the control of switching the connection destination of the output terminal of the SW 82 to the input terminal 2. The address setting data generated in the address setting data transmission control section 38 is transmitted from the second communication section 40 to the upper-stage IC as the transmission data by switching the connection destination of the output destination of the SW 82 to the input terminal 2. Further, the reception data received by the first communication section 34 is not transmitted from the second communication section 40 to the upper-stage IC. Note that, the operation at timing T2 and the operation at timing T3 are described as performed at different timings for convenience in description, but in fact, both the operations are performed almost at the same timing.

In the IC1, the third terminal 44 is connected to the ground, and L-level identification signal is input, and thus, the address setting processing section 61 of the address setting section 36 identifies the state of being connected to the control section 12. Further, since the address value of the memory section 60 is not "0", the address setting data generation request signal is generated and output to the address setting data generating section 72.

At a timing T4, the address setting data generating section 72 of the address setting data transmission control section 38 of the IC1 reads out the address setting command and the reliability checking data from the storage section 70, generates the address setting data, and outputs the address setting data to the second communication section 40. The address setting data is sent as the transmission data from the second communication section 40 of the IC1 to the IC2 via the communication line 16. The first communication section 34 of the IC2 receives the transmission data, which is the address setting data, as the reception data.

At timing T4, the address setting processing section 61 of the IC2 does not generate the address setting data generation request signal, since the H-level identification signal is input to the third terminal 44. Accordingly, in the address setting data transmission control section 38 of the IC2, the address setting data is not generated. Further, the connection destination of the output terminal is the input terminal 2 in the SW 82 of the second communication section 40 of the IC2, and thus, the reception data (the address setting data) received from the IC1 is not transmitted to the upper-stage IC3. In the same manner, in the IC3 and the IC4, the H-level identification signal is input to the third terminal 44, and thus, the address setting processing section 61 does not generate the address setting data generation request signal.

At a timing T5, the address setting data generating section 72 of the address setting data transmission control section 38 of the IC1 generates the address calculation process request signal, and outputs the address calculation process request signal to the address setting processing section 61 of the address setting section 36 when the output of the address setting data ends. The address calculation processing section 62 of the address setting processing section 61 performs calculation of subtracting "1" from the address value, which has been set in the memory section 60, and sets the calculation result in the memory section 60 as the address value when the address calculation process request signal is input. Accordingly, the address calculation processing section 62 of the IC1 calculates "3−1=2" and sets "2" in the memory section 60 as the address value.

In the IC2, the address setting data is received for the first time after the initial address setting data is received, and thus, the address setting processing section 61 does not perform any process with respect to the address value of the memory section 60. Accordingly, the address value set in the memory section 60 of the IC2 is still "3".

Further, at timing T5, since the address setting data is received in the IC2, the command determining section 66 generates the address setting identification signal and outputs address setting identification signal to the data selection control section 80. The data selection control section 80 of the second communication section 40 performs the control of switching the connection destination of the output terminal of the SW 82 from the input terminal 2 to the input terminal 1. The reception data received by the first communication section 34 is output directly to the second communication section 40 and is transmitted from the second communication section 40 to the upper-stage IC3 as the transmission data by switching the connection destination of the output destination of the SW 82 to the input terminal 1.

At a timing T6, the address setting processing section 61 of the IC1 generates the address setting data generation request signal, and outputs the address setting data generation request signal to the address setting data generating section 72 of the address setting data transmission control section 38, since the address value which has been set in the memory section 60 is not "0". As similarly to timing T4, the address setting data generating section 72 of the IC1 generates the address setting data, and transmits the address setting data from the second communication section 40 to the upper-stage IC2 as the transmission data.

At timing T6, the address setting processing section 61 of the IC2 does not generate the address setting data generation request signal since the H-level identification signal is input to the third terminal 44. Accordingly, the address setting data is not generated in the address setting data transmission control section 38 of the IC2. Further, the output terminal is connected to the input terminal 1 in the SW 82 of the second communication section 40 of the IC2, and thus, the reception data (the address setting data) received from the IC1 is output from the first communication section 34 directly to the second communication section 40 and is transmitted from the second communication section 40 to the upper-stage IC3. In the same manner, in the IC3, the H-level identification signal is input to the third terminal 44, and thus, the address setting processing section 61 does not generate address setting data request signal.

At a timing T7, the IC1, that has ended transmitting the address setting data for the second time, performs the same process as at timing T2, and sets in the memory section 60 the address value "1" (2−1).

At timing T7, in the IC2, since the reception of the address setting data is not the first time (second or subsequent time) after the initial address setting data is received, the address setting processing section 61 performs calculation of subtracting "1" from the address value which has been set in the memory section 60. Thus, the address value set in the memory section 60 of the IC2 becomes "2" (3−1).

At timing T7, in the IC3, similarly to the IC2 at timing T5, since the initial address setting data is received for the first time after the initial address setting data is received, the address setting processing section 61 does not perform any process with respect to the address value of the memory section 60. Accordingly, the address value set in the memory section 60 of the IC3 is still "3". Further, since the address setting data is received in the IC3, the command determining section 66 outputs the address setting identification signal and the data selection control section 80 performs the control of switching the connection destination of the output terminal of the SW 82 from the input terminal 2 to the input terminal 1. The reception data is output from the first communication section 34 to the second communication section 40, and is transmitted from the second communication section 40 directly to the upper-stage IC4 as the transmission data by switching the connection destination of the output destination of the SW 82.

At a timing T8, the address setting processing section 61 of the IC1 generates the address setting data generation request signal again, and outputs the address setting data generation request signal to the address setting data generating section 72 of the address setting data transmission control section 38 since the address value set in the memory section 60 is not "0". Similarly to timing T4, the address setting data generating section 72 of the IC1 generates the address setting data, and transmits the address setting data from the second communication section 40 to the upper-stage IC2 as the reception data.

At timing T8, the address setting processing section 61 of the IC2 and the IC3 does not generate the address setting data generation request signal since the H-level identification signal is input to the third terminal 44. Accordingly, the address setting data is not generated in the address setting data transmission control section 38 of the IC2 and the IC3. Further, the connection destination of the output terminal is the input terminal 1 in the SW 82 of the second communication section 40 of the IC2 and the IC3, and thus, the transmission data (the address setting data) transmitted from the IC1 passes through the IC2 and the IC3 and is transmitted to the IC4. In the same manner, in the IC4, the H-level identification signal is input the third terminal 44, and thus, the address setting processing section 61 does not generate the address setting data generation request signal.

At a timing T9, the IC1, in which the transmission of the address setting data for the third time ends, performs the same process as at timing T2 again, to set the address value, which has been set in the memory section 60, to "0" (1−1). The address setting processing section 61 of the IC1 generates the address setting completion signal, and outputs the address setting completion signal to the data selection control section 80 of the second communication section 40 since the address value is "0". The data selection control section 80 performs the control of switching the connection destination of the output terminal of the SW 82 from the input terminal 2 to the input terminal 1. The reception data is output from the first communication section 34 to the second communication section 40, and is transmitted from the second communication section 40 directly to the upper-stage IC2 as the transmission data by switching the connection destination of the output destination of the SW 82 to the input terminal 1. Further, the IC1 is in a state in which the second communication section 40 and the address setting data transmission control section 38 are disconnected from one another.

At timing T9, in the IC2 and the IC3, since the reception of the address setting data is not the first time (second or subsequent time) after the initial address setting data is received, the address setting processing section 61 performs the calculation of subtracting "1" from the address value which has been set in the memory section 60. Thus, the address value set in the memory section 60 of the IC2 becomes "1" (2−1). Further, the address value set in the memory section 60 of the IC3 becomes "2" (3−1).

At timing T9, in the IC4, since the address setting data is received for the first time after the initial address setting data is received, the address setting processing section 61 does not perform any process with respect to the address value of the memory section 60. Accordingly, the address value set in the memory section 60 of the IC4 is still "3". Further, since the address setting data is received in the IC4, the command determining section 66 outputs the address setting identification signal, and the data selection control section 80 performs the control of switching the connection destination of the output terminal of the SW 82 from the input terminal 2 to the input terminal 1.

In this manner, the address value="0" is set in the IC1, the address value="1" is set in the IC2, the address value="2" is set in the IC3, and the address value="3" is set in the IC4. When the setting of the address value is completed at timing T10, the IC1 generates the end signal as an interrupt signal, and transmits the end signal to the control section 12 via the first communication section 34 and the communication line 14. It is possible to recognize that the setting of the address value in each IC is completed according to the end signal in the control section 12.

As described above, in the battery monitoring system 10 according to the first exemplary embodiment, each of the IC's are daisy-chain connected, and each IC includes the first communication section 34, the address setting section 36, the address setting data transmission control section 38, and the second communication section 40. In the case where the reception data is the initial address setting data, the address setting section 36 sets the initial value of the address value in the memory section 60 based on the initial address setting data using the initial address setting section 64. On the other hand, in a case where the reception data is the address setting data, which has been received for the second or subsequent time after the initial address setting data is received, or in a case where the address calculation process request signal is input, the address setting processing section 61 performs the re-setting by subtracting "1" from the address value which has been set in the memory section 60.

Further, the address setting data generation request signal is output to the address setting data generating section 72 only by the address setting processing section 61 of the IC1, which is identified as being connected with the control section 12, based on the identification signal input to the third terminal 44. Thus, only the address setting data generating section 72 of the IC1 generates the address setting data and transmits the address setting data to the upper-stage IC2 via the second communication section 40.

Further, in each IC, it is possible to switch the transmission data transmitted to the upper-stage IC between the address setting data generated by itself and the reception data received from the lower-stage IC (or the control section 12), by switching the connection destination of the output terminal of the SW 82 of the second communication section 40 between the input terminal 1 and the input terminal 2, based on the number of times of receiving the initial address setting data and the address setting data. Thus, in the IC2 to the IC4, it is possible to transmit the address setting data received from the lower-stage IC (the IC1 to the IC3) directly to the upper-stage IC (the IC3 and the IC4, and no transmission from the IC4) without generating the address setting data.

Accordingly, only the IC1 which performs communication with the control section 12 performs the generation and transmission of the address setting data, and thus, the reception timing of the reception data and the transmission timing of the transmission data do not overlap with one another. Thus, there hardly occurs a case where the address values are set to be overlapped, for example, even when the frequency gap (deviation in cycle) of the reference clock between each IC is not considered.

In general, in a case where the frequency gap of the reference clock between each IC is considered, a method of providing a functional section (circuit) that performs management such that the number of the reception data matches with the number of the reception data in each IC, or increasing a communication interval of the transmission data in consideration of the frequency gap of the reference clock is generally considered. However, there is concern of introducing increase in circuit size and increase in time for setting the address value. On the other hand, the battery monitoring system 10 according to the first exemplary embodiment may suppress such concern since the frequency gap of the reference clock between each IC is not necessarily considered.

Further, the load of the control section 12 may be reduced since the initial address setting data may be transmitted to the IC1 only in the beginning. Further, the load of the control section 12 may be reduced since the IC1 manages the completion of the setting of the address value and transmits the end signal to the control section 12. The load of the control section 12 may be reduced as compared to that of a case where the control section 12 generates each address value of all the IC's and transmits the address value to each IC, for example.

Accordingly, the first exemplary embodiment may suppress the load of the control section and appropriately perform the setting of the address value in the battery monitoring system 10 (the IC).

Second Exemplary Embodiment

The IC1 connected to the control section 12 generates and outputs the address setting data until the address value of itself (the subject device) becomes "0" in the first exemplary embodiment. However, a description will be made regarding a case where the IC1 generates and outputs the address setting data according to the number of generation of address setting data, in a second exemplary embodiment.

Regarding the same configuration and operation as in the first exemplary embodiment, detailed description thereof will be omitted. A configuration of the entire battery monitoring system 10 according to the second exemplary embodiment is the same as the configuration of the battery monitoring system 10 illustrated in FIG. 1 of the first exemplary embodiment, and thus, a detailed description thereof will be omitted.

Figure 6:
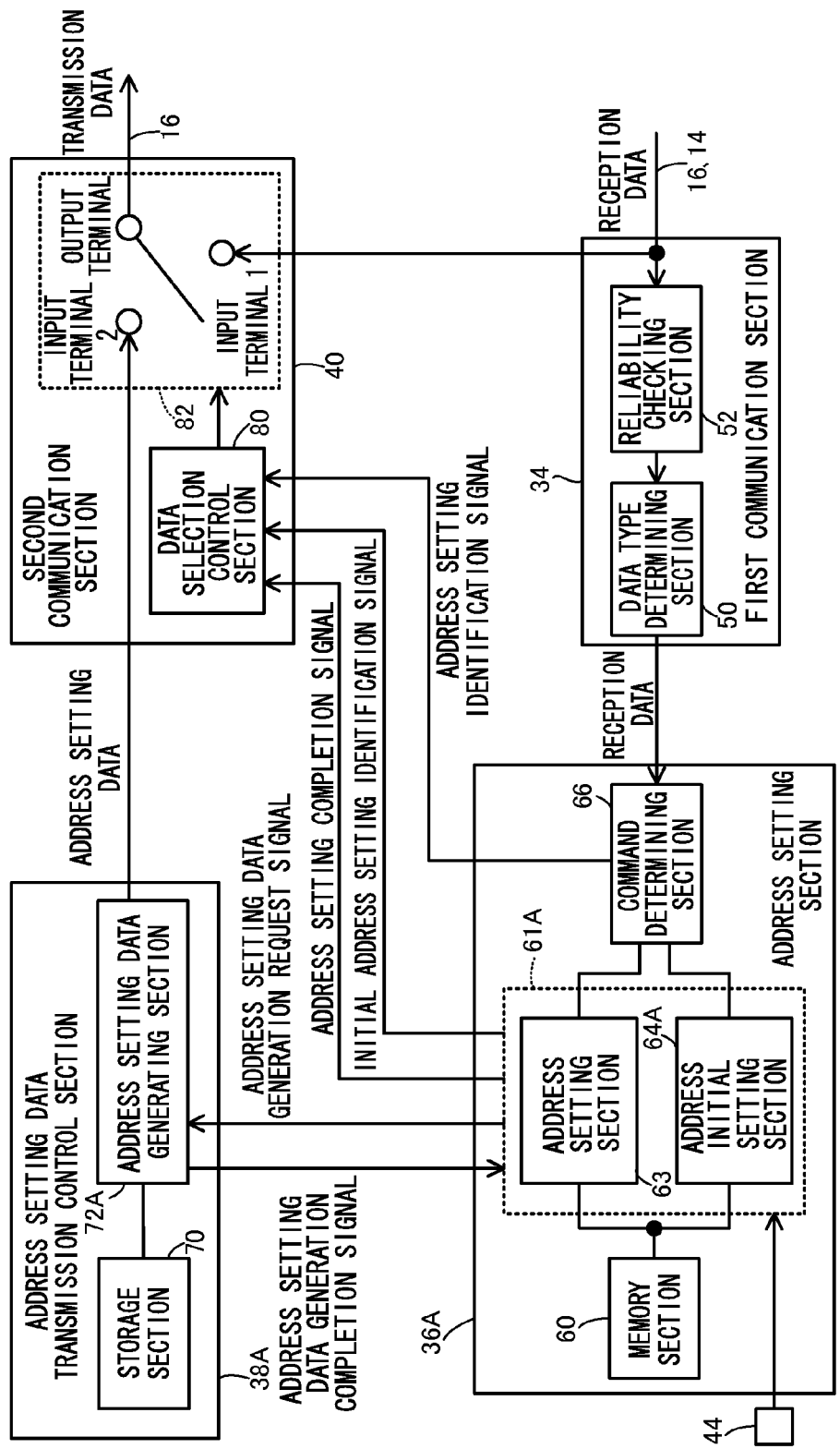
FIG. 6 is a functional block diagram representing a configuration for performing an address value setting operation in each IC according to a second exemplary embodiment.

FIG. 6 illustrates a functional block diagram representing a configuration for performing an address value setting operation in each IC according to the second exemplary embodiment. As illustrated in FIG. 6, each IC according to the second exemplary embodiment includes the first communication section 34, an address setting section 36A, an address setting data transmission control section 38A, and the second communication section 40. Namely, the IC according to the second exemplary embodiment includes the address setting section 36A instead of the address setting section 36 of the IC according to the first exemplary embodiment, and further, the address setting data transmission control section 38A instead of the address setting data transmission control section 38.

The address setting section 36A according to the second exemplary embodiment includes the memory section 60, an address setting processing section 61A, and the command determining section 66. Further, the address setting processing section 61A includes an address setting section 63 and an initial address setting section 64A. Namely, the address setting processing section 61A according to the second exemplary embodiment includes the address setting section 63 instead of the address calculation processing section 62 of the address setting processing section 61 according to the first exemplary embodiment, and the initial address setting section 64A instead of the initial address setting section 64.

The initial address setting section 64A set an initial value of an address value, and the number of generation of address setting data in the memory section 60 in a case where the command type determined in the command determining section 66 is the initial address setting command, that is, a case where the reception data is the initial address setting data.

The address setting section 63 sets the address value according to the received address setting data in the memory section 60 in a case where the command type determined in the command determining section 66 is the address setting command, that is, a case where the reception data is the address setting data. Further, the address setting section 63h outputs the address setting data generation request signal to the address setting data transmission control section 38A according to the identification signal and the address value input to the third terminal 44.

The address setting data transmission control section 38A includes the storage section 70 and an address setting data generating section 72A. Namely, the address setting data transmission control section 38A according to the second exemplary embodiment includes the address setting data generating section 72A instead of the address setting data generating section 72 according to the first exemplary embodiment.

The address setting data generating section 72A generates and outputs the address setting data, according to the address setting data generation request signal as similarly to the address setting data generating section 72 according to the first exemplary embodiment. Further, the address setting data generating section 72A generates the address setting data generation completion signal and outputting the address setting data generation completion signal to the address setting section 63 of the address setting section 36A when the output of the address setting data is completed.

Next, a description will be made regarding the address value setting operation of each IC in the battery monitoring system 10 according to the second exemplary embodiment. Here, similarly to the first exemplary embodiment, the description will be made regarding the address value setting operation in the battery monitoring system 10 in which n=4, that is, four IC's (the IC1 to the IC4) are daisy-chain connected.

Figure 7:
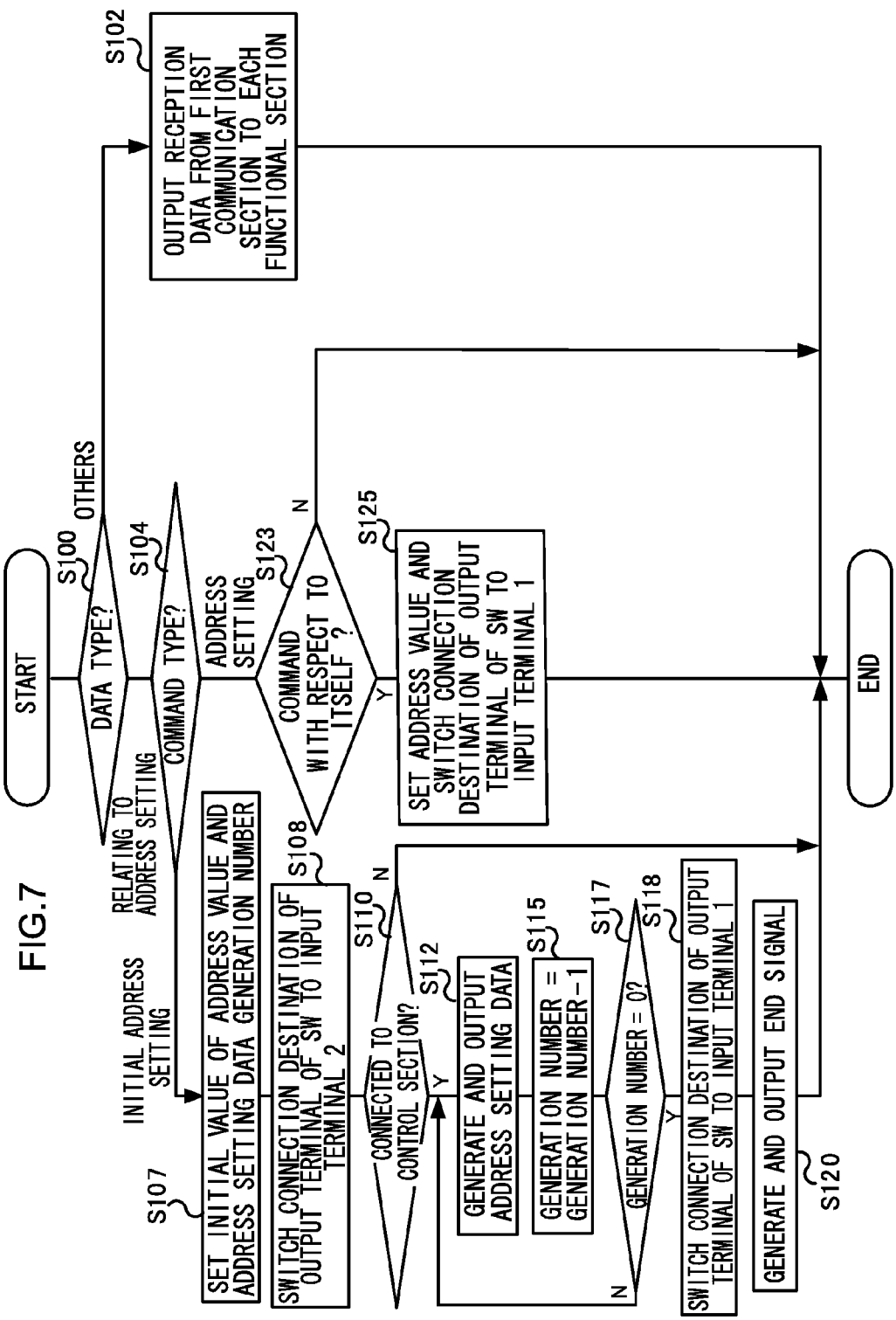
FIG. 7 is a flowchart representing a flow of the address value setting operation in each IC according to the second exemplary embodiment.

FIG. 7 illustrates a flowchart representing a flow of the address value setting operation in each IC. First, a description will be made regarding an overview of the setting operation of the IC according to the second exemplary embodiment with reference to the flowchart illustrated in FIG. 7, and then the setting operation will be described in detail for each IC. The same step number is attached to the same process (operation) as in the setting operation (see FIG. 4) according to the first exemplary embodiment, among the processes (operations) in the flowchart illustrated in FIG. 7.

Steps S100 to S104 are the same as in the setting operation according to the first exemplary embodiment. In a case where the type of the reception data is not data relating to the address setting, the reception data is output from the data type determining section 50 of the first communication section 34 to each functional section, and the process ends. On the other hand, in a case where the type of the reception data is the data relating to the address setting, the command determining section 66 determines the command type and the process proceeds to step S107 in a case where the command type is the initial address setting.

In the setting operation according to the second exemplary embodiment, step S107 is provided instead of step S106 of the first exemplary embodiment.

In step S107, the initial address setting section 64A of the address setting processing section 61A sets the initial value of the address value and the address setting data generation number in the memory section 60 based on the initial address setting data.

In the next step S108, the connection destination of the output terminal of the SW 82 is switched to the input terminal 2 by the control of the data selection control section 80. Accordingly, the address setting data generated in the address setting data transmission control section 38A is transmitted to the subsequent stage IC from the second communication section 40. Further, in each IC, the reception data received from the input terminal 1 of the SW 82 (the control section 12 in the case of the IC1) of the second communication section 40 in the previous stage IC is not transmitted from the SW 82 of the second communication section 40 to the subsequent stage IC.

In the next step S110, the address setting processing section 61A identifies whether the subject IC is connected to the control section 12 according to the level of the identification signal input to the third terminal 44. In the case of not being connected to the control section 12, the operation ends. On the other hand, in the case of being connected to the control section 12, the process proceeds to step S112, and the address setting data generating section 72A of the address setting data transmission control section 38A generates the address setting data, and transmits the address setting data to the subsequent-stage IC via the second communication section 40. Then, the process proceeds to step S115.

In the setting operation according to the second exemplary embodiment, steps S115 and S117 are provided instead of steps S114 and S116 of the first exemplary embodiment. In step S115, the address setting section 63 of the address setting processing section 61A performs calculation of subtracting "1" from the address setting data generation number, which has been set in the memory section 60, and sets a result of the calculation in the memory section 60 as a new address setting data generation number.

In the next step S117, the address setting processing section 61A determines whether the address setting data generation number is "0", and in a case where the address setting data generation number is not "0", the process returns to step S112, and the generation and output of the address setting data, and the calculation and the setting of the address setting data generation number are repeated. On the other hand, in a case where the address setting data generation number is "0", the process proceeds to step S118.

In step S118, the connection destination of the output terminal of the SW 82 of the second communication section 40 is switched from the input terminal 2 to the input terminal 1. Accordingly, in the IC1, the reception data received from the control section 12 by the first communication section 34 is transmitted from the second communication section 40 directly to the upper stage IC (the IC2) after the setting of the address value is completed. On the other hand, the IC1 is in a state in which the second communication section 40 and the address setting data transmission control section 38 are disconnected with one another.

In the next step S120, the address setting section 36 generates the end signal and transmits the end signal to the control section 12 since the setting of the address value is completed, and then the operation ends. Accordingly, when the initial address setting data is received in the IC (the lowermost-stage IC) connected to the control section 12, the generation and the output of the address setting data are repeated, and further, the calculation and the setting of the address setting data generation number are repeated until the setting of the address value is completed.

In a case where the command determining section 66 determines that the command type is the address setting in step S104, that is, a case where the reception data is the address setting data, the process proceeds to step S123. Even in the battery monitoring system 10 according to the second exemplary embodiment, only the IC which is not connected to the control section 12 receives the address setting data.

In the setting operation according to the second exemplary embodiment, steps S123 and S125 are provided instead of steps S122 and S124 of the first exemplary embodiment. Step S126 of the first exemplary embodiment is not provided in the setting operation according to the second exemplary embodiment.

In step S123, the address setting processing section 61A of the address setting section 36A determines whether the command is a command for itself, based on the address setting data. In the case of not being the command for itself, the operation ends. On the other hand, in the case of being the command for itself, the process proceeds to step S125.

In step S125, the address setting section 63 sets the address value stored in the memory section 60 based on the address setting data. Further, the command determining section 66 outputs the address setting identification signal, and switches the connection destination of the output terminal of the SW 82 to the input terminal 1, and then, the operation ends. Accordingly, the address setting data is input in the IC which is not connected to the control section 12 until the setting of the address value is completed, and thus, the operations of steps S100, S104, S123, and S125 are repeated.

Figure 8:
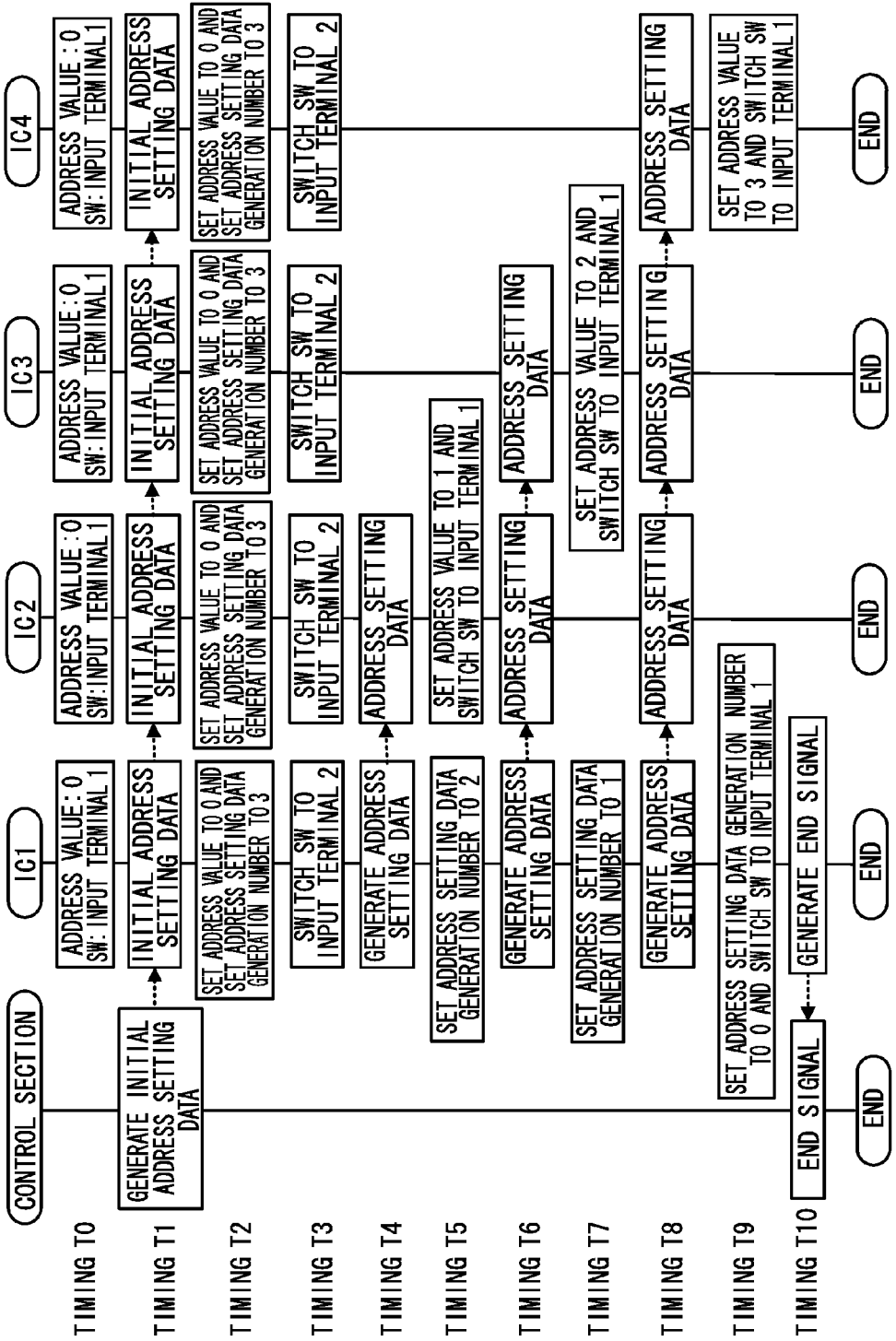
FIG. 8 is a flowchart representing a flow of a setting operation in a control section and each IC according to the second exemplary embodiment.

Next, the detailed setting operation will be described for each IC. FIG. 8 illustrates a flowchart representing a flow of the setting operation in the control section 12 and each IC.

First, similarly to timing T0 (see FIG. 5) of the first exemplary embodiment, the battery monitoring system 10 is initialized to be in an operable state when the power thereof is turned ON at timing T0. First, when the power is turned ON (before the address value setting operation) in the initial state, the address value is set in "0" in all the IC's. Further, the output terminal of the SW 82 of the second communication section 40 is connected to the input terminal 1. Thus, the reception data received by the first communication section 34 is output from the first communication section 34 to the second communication section 40 and is transmitted, via the communication line 16, directly to the upper-stage IC as the transmission data.

Next, similarly to timing T1 (see FIG. 5) of the first exemplary embodiment, the control section 12 transmits the initial address setting data to the IC1 having the initial setting value of the address value of "3" (the number (n) of all stages in the daisy-chain connection−1), using a command which can be set in all the IC's at timing T1. In each IC, the received initial address setting data is transmitted directly to the subsequent-stage IC since the output terminal of the SW 82 of the second communication section 40 is connected to the input terminal 1.

Further, at timing T1, the reliability of the reception data is verified by the reliability checking section 52 of the first communication section 34 in each IC receiving the initial address setting data. In a case where the reliability is satisfied, the type of the reception data is determined in the data type determining section 50. In the case of being determined as the data relating to the setting of the address value, the reception data is output to the address setting section 36A.

At timing T2, the command determining section 66 of the address setting section 36A determines the command type of the reception data. When the command determining section 66 determines that the command type is the initial address setting data, the initial address setting section 64A of the address setting processing section 61A sets the initial setting value of "0" in the memory section 60 as the address value, and sets the address setting data generation number to "3".

In the battery monitoring system 10 according to the second exemplary embodiment, only the IC1 connected to the control section 12 generates the address setting data, and the IC2 to the IC4 do not generate the address setting data, and thus, the setting of the address setting data generation number is not necessarily performed in the IC2 to the IC4. For example, in the IC2 to the IC4, the address setting data generation number is not necessarily set in the memory section 60 based on the identification signal input to the third terminal 44.

Similarly to timing T3 (see FIG. 5) according to the first exemplary embodiment, the address setting processing section 61A generates the initial address setting identification signal, and outputs the initial address setting identification signal to the second communication section 40 at timing T3. The data selection control section 80 of the second communication section 40 performs the control of switching the connection destination of the output terminal of the SW 82 to the input terminal 2. The address setting data generated in the address setting data transmission control section 38A is transmitted from the second communication section 40 to the upper-stage IC as the transmission data by switching the connection destination of the output destination of the SW 82 to the input terminal 2. Further, the reception data received by the first communication section 34 is not transmitted from the second communication section 40 to the upper-stage IC. Note that, the operation at timing T2 and the operation at timing T3 are described as performed at different timings for convenience in description, but in fact, both the operations are performed almost at the same timing.

In the IC1, the L-level identification signal is input to the third terminal 44, and thus, the address setting processing section 61A of the address setting section 36A identifies the state of being connected to the control section 12. Further, since the address setting data generation number of the memory section 60 is not "0", the address setting data generation request signal is generated and output to the address setting data generating section 72A.

At timing T4, the address setting data generating section 72A of the address setting data transmission control section 38A of the IC1 reads out an address setting command and the reliability checking data from the storage section 70, generates the address setting data and outputs the address setting data to the second communication section 40. In the second exemplary embodiment, the address setting command is a command of setting the address value to "1" with respect to the IC having the address value of "0". The address setting data is transmitted, as the transmission data, from the second communication section 40 of the IC1 to the IC2 via the communication line 16. The first communication section 34 of the IC2 receives the transmission data, which is the address setting data, as the reception data.

At timing T4, since the H-level identification signal is input to the third terminal 44 in the address setting processing section 61A of the IC2, the address setting data generation request signal is not generated. Accordingly, the address setting data is not generated in the address setting data transmission control section 38A of the IC2. Further, the connection destination of the output terminal is the input terminal 2 in the SW 82 of the second communication section 40 of the IC2, and thus, the reception data (the address setting data) received from the IC1 is not transmitted to the upper-stage IC3. In the same manner, also in the IC3 and the IC4, the H-level identification signal is input to the third terminal 44, and thus, the address setting processing section 61A does not generate the address setting data generation request signal.

At timing T5, the address setting data generating section 72A of the address setting data transmission control section 38A of the IC1 generates the address setting data generation completion signal and outputs the address setting data generation completion signal to the address setting processing section 61A of the address setting section 36A when the output of the address setting data ends. The address setting section 63 of the address setting processing section 61A performs calculation of subtracting "1" from the address setting data generation number, which has been set in the memory section 60, and sets the calculation result in the memory section 60 as the address setting data generation number when the address setting data generation completion signal is input. Accordingly, the address setting section 63 of the IC1 calculates "3−1=2" and sets "2" in the memory section 60 as the address setting data generation number.

At timing T5, in the IC2, the command determining section 66 of the address setting section 36A outputs the address setting identification signal based on the address setting data. Further, it is determined that the command of the address setting data is the command to itself since the address value stored in the memory section 60 is "0", and then, the address setting section 63 sets "1" in the memory section 60 as the address value based on the address setting data. Accordingly, in the IC2, the address value stored in the memory section 60 is re-written from "0" to "1".

Further, the data selection control section 80 of the second communication section 40 performs the control of switching the connection destination of the output terminal of the SW 82 from the input terminal 2 to the input terminal 1 based on the address setting identification signal. The reception data received by the first communication section 34 is output directly to the second communication section 40, and is transmitted from the second communication section 40 to the upper-stage IC3 as the transmission data by switching the connection destination of the output destination of the SW 82 to the input terminal 1.

At timing T6, the address setting processing section 61A of the IC1 generates the address setting data generation request signal again and outputs the address setting data generation request signal to the address setting data generating section 72A since the address setting data generation number set in the memory section 60 is not "0". The address setting data generating section 72A of the IC1 generates the address setting data having the address setting command as a command of setting the address value to "2" with respect to the IC having the address value of "0", and transmits the address setting data from the second communication section 40 to the upper-stage IC2.

At timing T6, the output terminal is connected to the input terminal 1 in the SW 82 of the second communication section 40 of the IC2, and thus, the reception data (the address setting data) received from the IC1 is output from the first communication section 34 directly to the second communication section 40, and is transmitted from the second communication section 40 to the upper-stage IC3. The IC3 receives the address setting data as the reception data.

At timing T7, the IC1, in which the transmission of the address setting data for the second time ends, performs the same process as at timing T5 again, thereby setting the address setting data generation number, which has been set in the memory section 60, to "1" (2−1).

At timing T7, the address value, which has been set in the memory section 60, is "1" in the IC2, and thus, no process is performed.

On the other hand, at timing T7, the command determining section 66 of the address setting section 36A outputs the address setting identification signal based on the address setting data in the IC3. Further, the command of the address setting data is determined to be the command for itself since the address value stored in the memory section 60 is "0", and the address setting section 63 sets "2" in the memory section 60 as the address value based on the address setting data. Accordingly, in the IC3, the address value stored in the memory section 60 is re-written from "0" to "2". Further, since the address setting data is received in the IC3, the command determining section 66 outputs the address setting identification signal, and the data selection control section 80 performs the control of switching the connection destination of the output terminal of the SW 82 from the input terminal 2 to the input terminal 1. The reception data is output from the first communication section 34 to the second communication section 40, and is transmitted from the second communication section 40 directly to the upper-stage IC4 as the transmission data by switching the connection destination of the output destination of the SW 82 to the input terminal 1.

At timing T8, the address setting processing section 61A of the IC1 generates the address setting data generation request signal again, and outputs the address setting data generation request signal to the address setting data generating section 72A of the address setting data transmission control section 38A, since the address setting data generation number, which has been set in the memory section 60, is not "0". The address setting data generating section 72A of the IC1 generates the address setting data having the address setting command as a command of setting the address value to "3" to the IC having the address value of "0" and transmits the address setting data from the second communication section 40 to the upper-stage IC2.

At timing T8, the connection destination of the output terminal is the input terminal 1 in the SW 82 of the second communication section 40 of the IC2 and the IC3, and thus, the transmission data (the address setting data) received by the IC1 is transmitted to the IC4. The IC4 receives the address setting data as the reception data.

At timing T9, the IC1, in which the transmission of the address setting data for the third time ends, performs the same process as at timing T5 again, thereby setting the address setting data generation number, which has been set in the memory section 60, to "0" (1−1). The address setting processing section 61A of the IC1 generates the address setting completion signal and outputs the address setting completion signal to the data selection control section 80 of the second communication section 40, since the address setting data generation number is "0". The data selection control section 80 performs the control of switching the connection destination of the output terminal of the SW 82 from the input terminal 2 to the input terminal 1. The reception data is output from the first communication section 34 directly to the second communication section 40, and is transmitted from the second communication section 40 to the upper-stage IC2 as the transmission data by switching the connection destination of the output destination of the SW 82 to the input terminal 1.

At timing T9, the address value, which has been set in the memory section 60, is "1" in the IC2, and the address value, which has been set in the memory section 60, is "2" in the IC3, and thus, no process is performed.

At timing T9, in the IC4, the command determining section 66 of the address setting section 36A outputs the address setting identification signal based on the address setting data. Further, the command of the address setting data is determined to be the command for itself since the address value stored in the memory section 60 is "0", and address setting section 63 sets "3" in the memory section 60 as the address value based on the address setting data. Accordingly, in the IC4, the address value stored in the memory section 60 is re-written from "0" to "3". Further, since the address setting data is received in the IC4, the command determining section 66 outputs the address setting identification signal, and the data selection control section 80 performs the control of switching the connection destination of the output terminal of the SW 82 from the input terminal 2 to the input terminal 1.

In this manner, the address value="0" is set in the IC1, the address value="1" is set in the IC2, the address value="2" is set in the IC3, and the address value="3" is set in the IC4. When the setting of the address value is completed at timing T10, the IC1 generates the end signal as the interrupt signal and transmits the end signal to the control section 12 via the first communication section 34 and the communication line 14. It is possible to recognize that the setting of the address value in each IC is completed according to the end signal in the control section 12.

As described above, in the battery monitoring system 10 according to the second exemplary embodiment, the address setting data generating section 72A of the IC1 generates the address setting data using the address setting commands for different address values, according to the number of times of generating the address setting data with respect to the IC having the set address value of the initial value of "0". In the IC2 to the IC4, in a case where it is determined that the address setting data is the data for itself, that is, a case where the initial value of "0" is set in the memory section 60 as the address value, the address setting section 63 sets the address value in the memory section 60 based on the address setting data.

Accordingly, similarly to the first exemplary embodiment, only the IC1, which performs communication with the control section 12, performs the generation and transmission of the address setting data, and thus, the reception timing of the reception data and the transmission timing of the transmission data do not overlap with one another. Thus, there hardly occurs the case where the address values are set to be overlapped, for example, even when the frequency gap (deviation in cycle) of the reference clock between each IC is not considered.

Further, similarly to the first exemplary embodiment, the present exemplary embodiment may suppress increase in circuit size and increase in time for setting the address value.

Further, similarly to the first exemplary embodiment, the present exemplary embodiment may reduce the load of the control section 12, since the control section 12 may transmit the initial address setting data to the IC1 only in the beginning, and the IC1 manages the setting of the address value.

Accordingly, the present exemplary embodiment may suppress the load of the control section and may appropriately perform the setting of the address value in the battery monitoring system 10 (the IC).

Third Exemplary Embodiment

According to each exemplary embodiment described above, the IC1 connected to the control section 12 generates the address setting data in the battery monitoring system 10. However, a description will be made regarding a case where the address setting data is generated in the control section 12 and is output to the IC1 in a battery monitoring system according to a third exemplary embodiment. Namely, the description will be made regarding a case where the control section 12, instead of the IC1 according to the first exemplary embodiment, generates the address setting data and outputs the address setting data to the IC1.

In the IC according to the third exemplary embodiment, the control section 12 generates the address setting data, and thus, the information (for example, the number of times of generation or the like) for generating the address setting data is stored in the memory section 18 of the control section 12.

Figure 9:
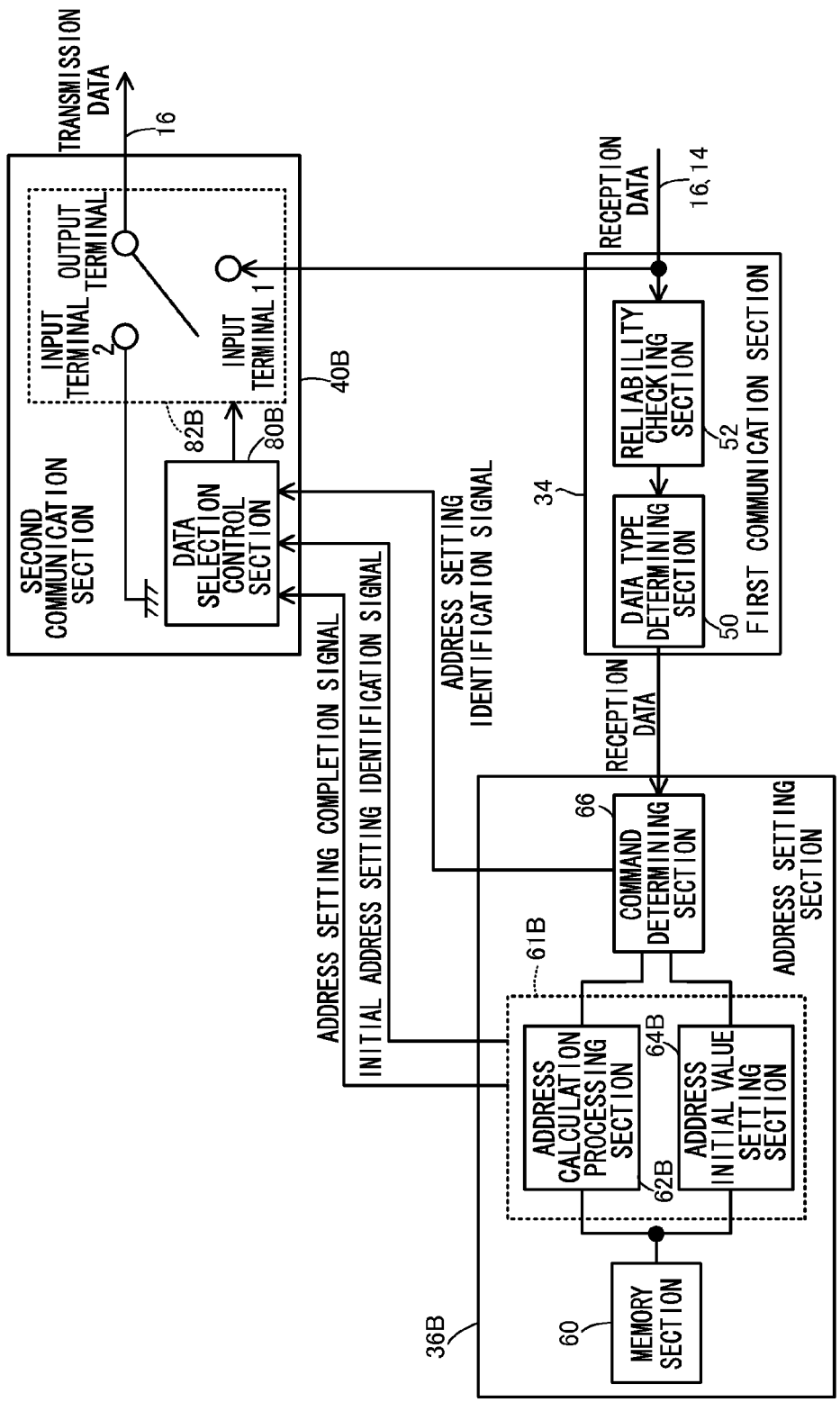
FIG. 9 is a functional block diagram representing a configuration for performing an address value setting operation in each IC according to a third exemplary embodiment.

FIG. 9 illustrates a functional block diagram representing a configuration for performing the address value setting operation in each IC according to the third exemplary embodiment. As illustrated in FIG. 9, each IC according to the third exemplary embodiment includes the first communication section 34, an address setting section 36B, and a second communication section 40B. Namely, the IC according to the third exemplary embodiment does not perform the generation and transmission of the address setting data, and thus, does not include the address setting data transmission control section 38 or 38A in the IC of each exemplary embodiment described above. Further, the address setting section 36B includes an address setting processing section 61B. The address setting processing section 61B includes an address calculation processing section 62B and the initial address setting section 64. Similarly to each exemplary embodiment described above, the address setting processing section 61B outputs the address setting completion signal and the initial address setting identification signal to a data selection control section 80B, but does not generate and output the address setting data generation request signal.

Further, the second communication section 40B according to the third exemplary embodiment includes the data selection control section 80B and an SW 82B. The SW 82B includes the input terminal 1, the input terminal 2, and the output terminal, but the input terminal 2 is fixed to the L level (as a specific example, the ground), differently from each exemplary embodiment described above. Thus, the first communication section 34 of the upper-stage IC is in a state of being fixed to the L level via the communication line 16 by connecting the output terminal with input terminal 2.

Next, a description will be made regarding the address value setting operation of each IC in the battery monitoring system 10 according to the third exemplary embodiment. Here, as a specific example, the description will be made regarding the address value setting operation in the battery monitoring system 10 in which n=4, that is, four IC's (the IC1 to the IC4) are daisy-chain connected.

FIG. 10 illustrates a flowchart representing an exemplary flow of the address value setting operation in each IC. First, a description will be made regarding an overview of the setting operation of the IC according to the third exemplary embodiment with reference to the flowchart illustrated in FIG. 10, and then, the setting operation will be described in detail for each IC.

In the setting operation of the third exemplary embodiment, the IC1 operates similarly to the IC2 to the IC4 in the setting operation according to the first exemplary embodiment. Thus, as illustrated in FIG. 10, the operations (processes) of steps S110 to S120 of the first exemplary embodiment (see FIG. 4) are not provided.

Further, in the third exemplary embodiment, when the address setting data is received, the IC1 to the IC4 repeat the operations (processes) of steps S100, S104 and S122 to S126 until the setting of the address value is completed, differently from the first exemplary embodiment.

Since the others are the same as in the setting operation according to the first exemplary embodiment, a description thereof will be omitted.

Next, the setting operation will be described in detail for each IC. FIG. 11 illustrates a flowchart representing a flow of the setting operation in the control section 12 and each IC.

The operations at timings T1 to T3 are the same as the operations at timings T1 to T3 according to the first exemplary embodiment, and thus, a detailed description thereof will be omitted.

According to the operations at timings T1 to T3, each memory section 60 of the IC is in a state in which the initial value of the address value is set to "3". Further, the non-connected state is formed between the output terminal and the input terminal 1 of each IC. Thus, each IC is in a state in which the reception data received by the first communication section 34 is not transmitted to the upper-stage IC.

At timing T4, the first communication section 34 of the IC1 receives the address setting data generated by the control section 12 as the reception data. In the IC1 to the IC4, the input terminal 2 of the SW 82B is fixed to the L level, and thus, the address setting data received by the IC1 is not transmitted to the upper-stage IC.

At timing T5, since the IC1 receives the address setting data for the first time after the initial address setting data is received, the address setting processing section 61B does not perform any process with respect to the address value of the memory section 60. Accordingly, the address value, which has been set in the memory section 60, of the IC2 is still "3".

Further, at timing T5, the IC1 receives the address setting data, and thus, the command determining section 66 generates the address setting identification signal and outputs the address setting identification signal to the data selection control section 80B. The data selection control section 80B of the second communication section 40B performs a control of connecting the output terminal of the SW 82B to the input terminal 1. The reception data received by the first communication section 34 is output directly to the second communication section 40, and is transmitted from the second communication section 40B to the upper-stage IC2 as the transmission data by connecting the output terminal with the input terminal 1 of the SW 82B.

At timing T6, the first communication section 34 of the IC1 receives the address setting data generated by the control section 12 as the reception data. Due to the connected state between the output terminal and the input terminal 1 of the SW 82B of the IC1, the address setting data received by the IC1 is output from the first communication section 34 to the second communication section 40, and is transmitted directly to the upper-stage IC2. In the IC3 and the IC4, the input terminal 2 of the SW 82B is fixed to the L level, and thus, the address setting data received by the IC1 is not transmitted to the upper-stage IC.

At timing T7, the reception of the address setting data is not the first time (second or subsequent time) after the initial address setting data is received in the IC1, and thus, the address setting processing section 61B performs the calculation of subtracting "1" from the address value which has been set in the memory section 60. Thus, the address value, which has been set in the memory section 60, of the IC1 becomes "2" (3−1).

On the other hand, at timing T7, the address setting data is received for the first time after the initial address setting data is received in the IC2, and thus, the address setting processing section 61B does not perform any process with respect to the address value of the memory section 60. Accordingly, the address value, which has been set in the memory section 60, of the IC2 is still "3".

Further, at timing T7, since the IC2 receives the address setting data, the reception data received by the first communication section 34 is output directly to the second communication section 40, and is transmitted from the second communication section 40B to the upper-stage IC3 as the transmission data by connecting the output terminal with the input terminal 1 of the SW 82B based on the address setting identification signal output from the command determining section 66.

At timing T8, the first communication section 34 of the IC1 receives the address setting data generated by the control section 12 as the reception data. Due to the connected state between the output terminal and the input terminal 1 of the SW 82B of the IC1 and the IC2, the address setting data received by the IC1 is output from the first communication section 34 to the second communication section 40, and is transmitted directly to the IC2 and the IC3 at the upper stage. In the IC3, the input terminal 2 of the SW 82B is fixed to the L level, and thus, the address setting data received by the IC1 is not transmitted to the upper-stage IC4.

At timing T9, the reception of the address setting data is not the first time (second of subsequent time) after the initial address setting data is received in the IC1 and the IC2, and thus, the address setting processing section 61B performs the calculation of subtracting "1" from the address value which has been set in the memory section 60. Thus, the address value, which has been set in the memory section 60, of the IC1 becomes "1" (2−1), and the address value, which has been set in the memory section 60, of the IC2 becomes "2" (3−1).

At timing T9, the address setting data is received for the first time after the initial address setting data is received in the IC3, and thus, the address setting processing section 61B does not perform any process with respect to the address value of the memory section 60. Accordingly, the address value, which has been set in the memory section 60, of the IC3 is still "3".

At timing T9, since the IC3 receives the address setting data, the reception data received by the first communication section 34 is output directly to the second communication section 40, and is transmitted from the second communication section 40B to the upper-stage IC4 as the transmission data by connecting the output terminal with the input terminal 1 of the SW 82B, based on the address setting identification signal output from the command determining section 66.

At timing T10, the first communication section 34 of the IC1 receives the address setting data generated by the control section 12 as the reception data. Due to the connected state between the output terminal and the input terminal 1 of the SW 82B of the IC1 to the IC3, the address setting data received by the IC1 passes through each IC and is transmitted to the IC2 to the IC4 at the upper stage.

At timing T11, the reception of the address setting data is not the first time (second or subsequent time) after the initial address setting data is received in the IC1 to the IC3, and thus, the address setting processing section 61B performs the calculation of subtracting "1" from the address value which has been set in the memory section 60. Accordingly, the address value, which has been set in the memory section 60, of the IC1 becomes "0" (1−1), the address value, which has been set in the memory section 60, of the IC2 becomes "1" (2−1), and the address value, which has been set in the memory section 60, of the IC3 becomes "2" (3−1).

At timing T11, the address setting data is received for the first time after the initial address setting data is received in the IC4, and thus, the address setting processing section 61B does not perform any process with respect to the address value of the memory section 60. Accordingly, the address value, which has been set in the memory section 60, of the IC4 is still "3".

At timing T11, since the IC4 receives the address setting data, the output terminal is connected with the input terminal 1 of the SW 82B based on the address setting identification signal output from the command determining section 66.

As described above, in the third exemplary embodiment, the control section 12 generates the address setting data and outputs the address setting data to the IC1, and the IC1 to the IC4 set the address value based on the address setting data.

In this manner, the control section 12 manages the setting of the address value in the battery monitoring system 10 according to the third exemplary embodiment. Accordingly, in the present exemplary embodiment, it is not necessary to generate and communicate the end signal in the IC1 of the battery monitoring system 10 as in each exemplary embodiment described above. Further, in the IC according to the third exemplary embodiment, it is not necessary to provide the address setting data transmission control section 38 and the third terminal 44, which are included in the IC in each exemplary embodiment described above. Accordingly, the present exemplary embodiment may reduce the circuit area.

Further, in the present exemplary embodiment, the address setting data may be one regardless of the number (for example, increase or decrease in the number) of the IC's in the daisy-chain connection. Accordingly, the present exemplary embodiment may suppress the use amount of the memory section 18, in which the address setting data is stored, in the control section 12.

Further, in the present exemplary embodiment, since the control section 12 only reads out the initial address setting data and the address setting data from the memory section 18, and transmits from the communication section 17, the load of the control section 12 may be reduced as compared to a case where the control section 12 generates the address values of all the IC's and transmits each address value to each IC.

Accordingly, the third exemplary embodiment may suppress the load of the control section and may appropriately perform the setting of the address value in the battery monitoring system 10 (the IC).

Note that, the number of the IC's (the number of stages in the daisy-chain) or the like, illustrated in each exemplary embodiment described above, is an example, and is not particularly limited thereto.

Further, in each exemplary embodiment described above, cases in which the control section 12 is connected to the lowermost-stage IC1 have been described. However, the IC, to which the control section 12 is connected, is not limited to the lowermost-stage IC. For example, the control section 12 may be connected to the first communication section 34 of the uppermost-stage IC (the IC4). In such case, the initial address setting data and the address setting data are transmitted from the uppermost-stage IC (the IC4) to the lowermost-stage IC (the IC1).

Further, in each exemplary embodiment described above, a case where the semiconductor device of the present invention is applied to the battery monitoring IC that monitors the battery voltage of the battery cell of the battery 20, have been described. However, the present invention is not limited thereto. There is no particular limit, and the present invention may be applied to a case where as long as the first communication section and the second communication section are semiconductor devices that are daisy-chain connected.

Further, the configurations, operations or the like of the battery monitoring system 10, the IC, the control section 12 or the like, described in each exemplary embodiment, are examples, and it is obvious that any modification is possible according to the situation within a scope not departing from a gist of the invention. Further, it is obvious that each exemplary embodiment described above may be combined.

What is claimed is:

1. A semiconductor device that is daisy-chain connected with other semiconductor devices, the semiconductor device comprising:
    a first communication circuit configured to receive reception data;
    a determining circuit configured to determine a type of the reception data, and to output a first control signal or a second control signal according to a result of the determination;
    a setting processing circuit configured, in a case in which the setting processing circuit receives the second control signal from the determining circuit, to set an address value in a memory based on the reception data, and to output a third control signal according to the setting of the address value; and
    a second communication circuit that includes a first input terminal to which the reception data is input, and an output terminal to which a communication line is connected, the second communication circuit configured to transmit transmission data to the other semiconductor devices, and cause the first input terminal and the output terminal to be in a connected state or a non-connected state based on the first control signal or the third control signal.

2. The semiconductor device according to claim 1, wherein in a case in which the type of the reception data is initial address setting data, the determining circuit is configured to output the second control signal, which sets the address value of the memory to an initial value based on the initial address setting data, to the setting processing circuit, and
    the setting processing circuit is configured to set the address value according to the initial address setting data in the memory, and output the third control signal, which causes the first input terminal and the output terminal to be in the non-connected state, to the second communication circuit.

3. The semiconductor device according to claim 1, wherein
    the semiconductor device includes a terminal that receives an identification signal, which identifies whether an external device connected to the first communication circuit is any one of the other semiconductor devices or a control circuit that controls all of the daisy-chain connected semiconductor devices;
    the second communication circuit includes a second input terminal, and the second communication circuit is configured to cause the second input terminal and the output terminal to be in the connected state based on the first control signal or the third control signal;
    the setting processing circuit is configured to identify the external device based on the identification signal, and, in a case in which a result of the identification is that the external device is the control circuit, to generate and output a request signal and output to the second communication circuit the third control signal, which causes the second input terminal and the output terminal to be in the connected state; and
    the semiconductor device further comprises a generating circuit configured to generate and output address setting data that includes information that sets an address value based on the request signal.

4. The semiconductor device according to claim 1, wherein, in a case in which the type of the reception data is address setting data that includes information that sets an address value, and the address setting data is received for a first time after receiving initial address setting data that sets an initial value of the address value in the memory, the determining circuit is configured to output to the second communication circuit the first control signal, which causes the first input terminal and the output terminal to be in the connected state.

5. The semiconductor device according to claim 4, wherein, in a case in which the type of the reception data is the address setting data, and a number of times that the address setting data has been received after the initial address setting data has been received is two or more, the determining circuit is configured to output to the setting processing circuit the second control signal, which sets the address value of the memory to a value based on the address setting data.

6. The semiconductor device according to claim 1, wherein, in a case in which the address value of the memory is an initial value, the determining circuit is configured to output to the setting processing circuit the second control signal, which sets the address value in the memory according to address setting data, and outputs the first control signal, which causes the first input terminal and the output terminal to be in the connected state.

7. A battery monitoring system comprising:
a plurality of batteries each including a plurality of battery cells that are connected in series;
a plurality of the semiconductor device according to claim 1, each one of which is connected to respective ones of the plurality of batteries, and that are daisy-chain connected with each other, each one of the plurality of the semiconductor devices measuring a battery voltage of the plurality of battery cells, and communicating a result of the measurement outside of the plurality of the semiconductor devices using the first communication circuit and the second communication circuit; and
a control circuit configured to control the plurality of the semiconductor devices, receive the measurement result from the plurality of the semiconductor devices, and that is connected to any one of the plurality of the semiconductor devices.

8. The battery monitoring system according to claim 7, wherein
the control circuit is configured to transmit initial address setting data to any one of the plurality of the semiconductor devices, and
any one of the plurality of the semiconductor devices generate address setting data and transmits the address setting data to the other semiconductor devices.

9. The battery monitoring system according to claim 7, wherein the control circuit is configured to transmit initial address setting data, and address setting data that includes information that sets the address value, to any one of the plurality of the semiconductor devices.

10. The semiconductor device according to claim 1, further comprising a control circuit configured to recognize the semiconductor device, which is daisy-chain connected with the other semiconductor devices, based on the address value.

* * * * *